US012765268B2

(12) United States Patent
Chuang et al.

(10) Patent No.: US 12,765,268 B2

(45) Date of Patent: Oct. 13, 2026

(54) MANUFACTURING METHOD OF MEMORY DEVICE WITH REMOVAL OF TOP ELECTRODE

(71) Applicant: TAIWAN SEMICONDUCTOR MANUFACTURING COMPANY, LTD., Hsinchu (TW)

(72) Inventors: Harry-Hak-Lay Chuang, Hsinchu County (TW); Hung-Cho Wang, Taipei City (TW); Sheng-Chang Chen, Hsinchu County (TW); Jun-Yao Chen, Taoyuan City (TW); Chang-Jen Hsieh, Hsinchu City (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 341 days.

(21) Appl. No.: 17/242,608

(22) Filed: Apr. 28, 2021

(65) Prior Publication Data

US 2022/0352457 A1 Nov. 3, 2022

(51) Int. Cl.

| | |
|---|---|
| ***H10N 50/80*** | (2023.01) |
| ***H10B 61/00*** | (2023.01) |
| ***H10N 50/01*** | (2023.01) |

(52) U.S. Cl.

CPC ............. *H10N 50/80* (2023.02); *H10B 61/22* (2023.02); *H10N 50/01* (2023.02)

(58) Field of Classification Search

CPC ........ H10N 50/80; H10N 50/01; H10N 50/10; H10B 61/22

See application file for complete search history.

(56) References Cited

U.S. PATENT DOCUMENTS

| | | | | |
|---|---|---|---|---|
| 9,190,260 | B1 * | 11/2015 | Zhang | H10N 50/10 |
| 2005/0090119 | A1 * | 4/2005 | Lee | H10B 61/00 257/E27.005 |
| 2018/0158728 | A1 * | 6/2018 | Chu | H10N 70/841 |
| 2018/0182810 | A1 * | 6/2018 | Yi | H10B 61/10 |
| 2018/0358547 | A1 * | 12/2018 | Yang | H10B 61/10 |
| 2019/0140018 | A1 * | 5/2019 | Kalnitsky | G11C 11/161 |
| 2019/0165258 | A1 * | 5/2019 | Peng | H10N 50/10 |
| 2020/0266335 | A1 * | 8/2020 | Wang | H10N 50/80 |
| 2021/0043828 | A1 * | 2/2021 | Hong | H10B 63/80 |
| 2022/0115583 | A1 * | 4/2022 | Wang | H10N 50/80 |

* cited by examiner

*Primary Examiner* — Brian Turner

*Assistant Examiner* — Zhijun Xu

(74) *Attorney, Agent, or Firm* — Birch, Stewart, Kolasch & Birch, LLP

(57) ABSTRACT

A method for manufacturing a memory device includes forming a dielectric layer over a substrate, in which the substrate has a cell region and a logic region adjacent to the cell region. A bottom electrode, a memory layer, and a top electrode are formed in sequence over the cell region of the substrate. A first spacer is formed extending upwards from the bottom electrode. A second spacer is formed extending upwards from the dielectric layer and lining with sidewalls of the bottom electrode and the first spacer.

16 Claims, 30 Drawing Sheets

MANUFACTURING METHOD OF MEMORY DEVICE WITH REMOVAL OF TOP ELECTRODE

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of feature that may be part of an integrated circuit is a magnetic tunnel junction (MTJ). An MTJ is a device that changes its resistive state based on the state of magnetic materials within the device. The MTJ involves spin electronics, which combines semiconductor technology and magnetic materials and devices. The spin polarization of electrons, rather than the charge of the electrons, is used to indicate the state of "1" or "0."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
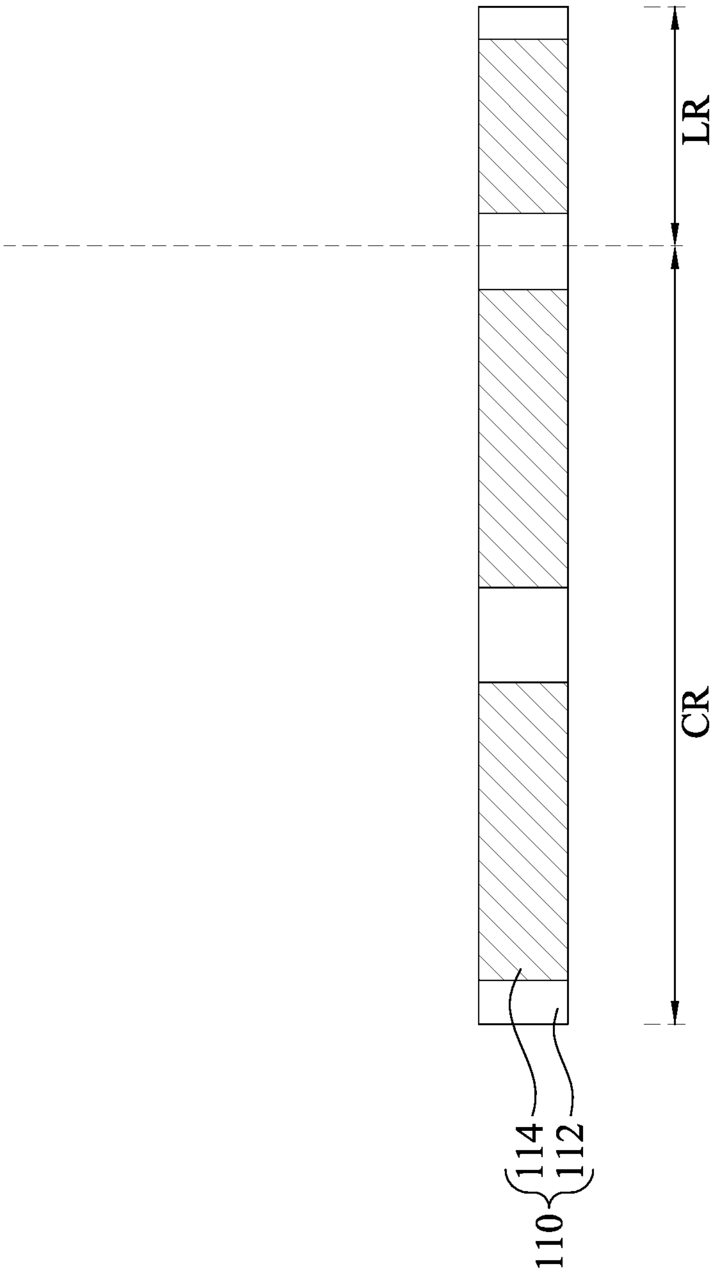
FIG. 1 to FIG. 19 are cross-sectional views of a memory device at various stages of manufacture in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

According to some embodiments of this disclosure, a magnetoresistive random access memory (MRAM) device is formed. The MRAM device includes a magnetic tunnel junction (MTJ) stack. The resistance switching element includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrode and an electric current flowing through the resistance switching element (tunneling through the tunnel barrier layer) from one electrode to the other is detected to determine the resistance and the digital signal state of the resistance switching element.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

Some embodiments of this disclosure relate to integrated memory fabrications and more specifically to magnetoresistive memory formations by forming a memory device without a top electrode. Because a top electrode via is directly and electrically connected to a memory layer, a process window of the top electrode via can be enlarged. Some embodiments of this disclosure relate to integrated memory fabrications and more specifically to magnetoresistive memory formations by forming a spacer outside a bottom electrode of a memory device. Because the spacer can protect the bottom electrode from being in contact with a top electrode via, short problem of the memory device can be avoided.

FIG. 1 to FIG. 19 are cross-sectional views of a memory device at various stages of manufacture in accordance with some embodiments of the present disclosure. FIG. 1 illustrates a wafer having a substrate 110 thereon. The substrate 110 has a logic region LR where logic circuits are to be formed and a cell region CR (memory region) where memory devices are to be formed. The logic region LR is disposed adjacent to the cell region CR. For example, the logic region LR surrounds the cell region CR. The substrate 110 includes an interlayer dielectric (ILD) layer or inter-metal dielectric (IMD) layer 112 with conductive features 114 over the logic region LR and the memory region CR. The ILD layer 112 may be a low-k dielectric layer made from extra low-k materials, extreme low-k materials, combinations thereof, or the like. In some embodiments, the ILD layer 112 has a dielectric constant lower than 2.4. In some embodiments, the ILD layer 112 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, the like or combinations thereof. The conductive feature 114 may include aluminum, aluminum alloy, copper, copper alloy, titanium, titanium nitride, tantalum, tantalum nitride, tungsten, cobalt, the like, and/or combinations thereof. Formation of the conductive feature 114 and the ILD layer 112 may be a dual-damascene process and/or a single-damascene process. The substrate 110 may also include active and passive devices, for example, underlying the ILD layer 112. These further components are omitted from the figures for clarity.

Figure 2:
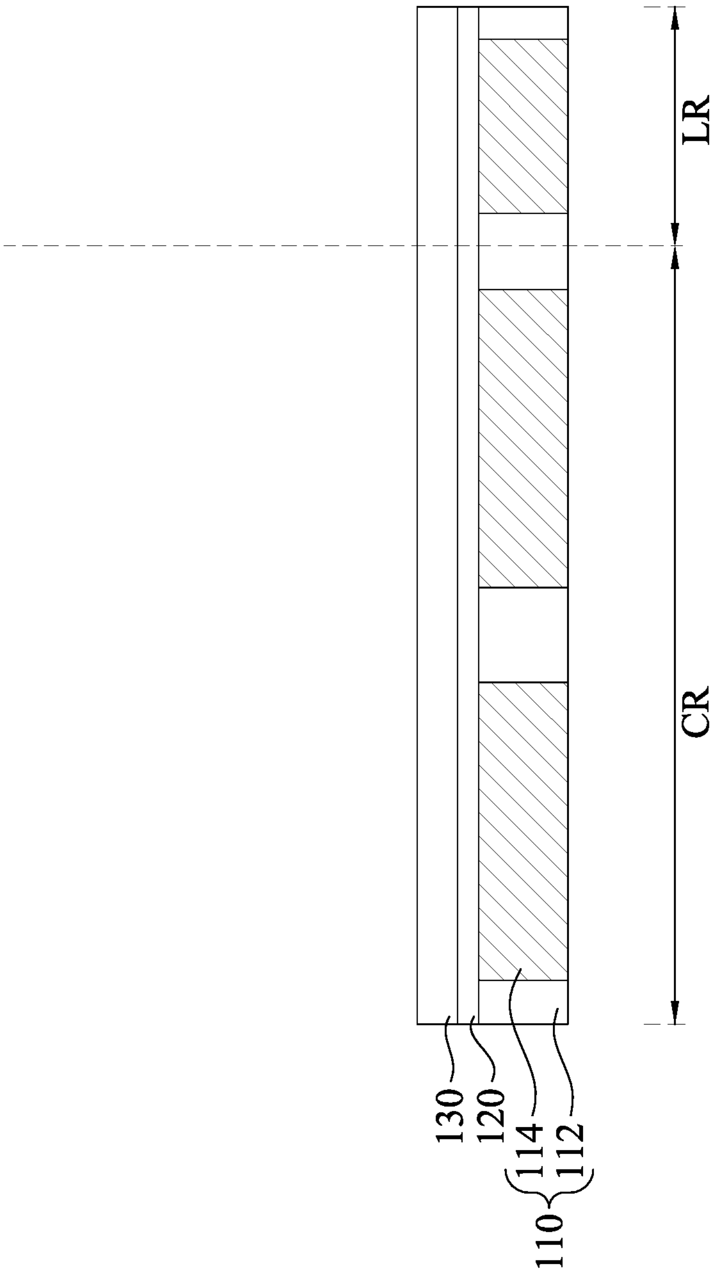

Reference is then made to FIG. 2. A first dielectric layer 120 and a second dielectric layer 130 are formed over the logic region LR and the cell region CR of the substrate 110 in a sequence. In some embodiments, the first dielectric layer 120 includes silicon carbide. In some other embodiments, the first dielectric layer 120 includes silicon oxide, low-k silicon oxide such as a porous silicon oxide layer, other suitable dielectric material, combinations thereof, or the like. In some embodiments, the first dielectric layer 120 may be deposited by an ALD process, a CVD process, a subatmospheric CVD (SACVD) process, a flowable CVD process, a PVD process, or other suitable process.

The second dielectric layer 130 may be formed of dielectric material different from the first dielectric layer 120. For example, the first dielectric layer 120 is made of silicon carbide, and the second dielectric layer 130 is made of silicon oxide. In some embodiments, the second dielectric layer 130 includes silicon oxynitride (SiON), silicon nitride (SiN), silicon oxide, TEOS-formed oxide, low-k dielectrics, black diamond, FSG, PSG, BPSG, the like, and/or combinations thereof. The second dielectric layer 130 may be a single-layered structure or a multi-layered structure. In some embodiments, the second dielectric layer 130 may be deposited over the first dielectric layer 120 by an ALD process, a CVD process, a subatmospheric CVD (SACVD) process, a flowable CVD process, a PVD process, or other suitable process. In some embodiments, an anti-reflection layer, for example, a nitrogen-free anti-reflection layer (NFARL) is optionally formed over the second dielectric layer 130.

Figure 3:
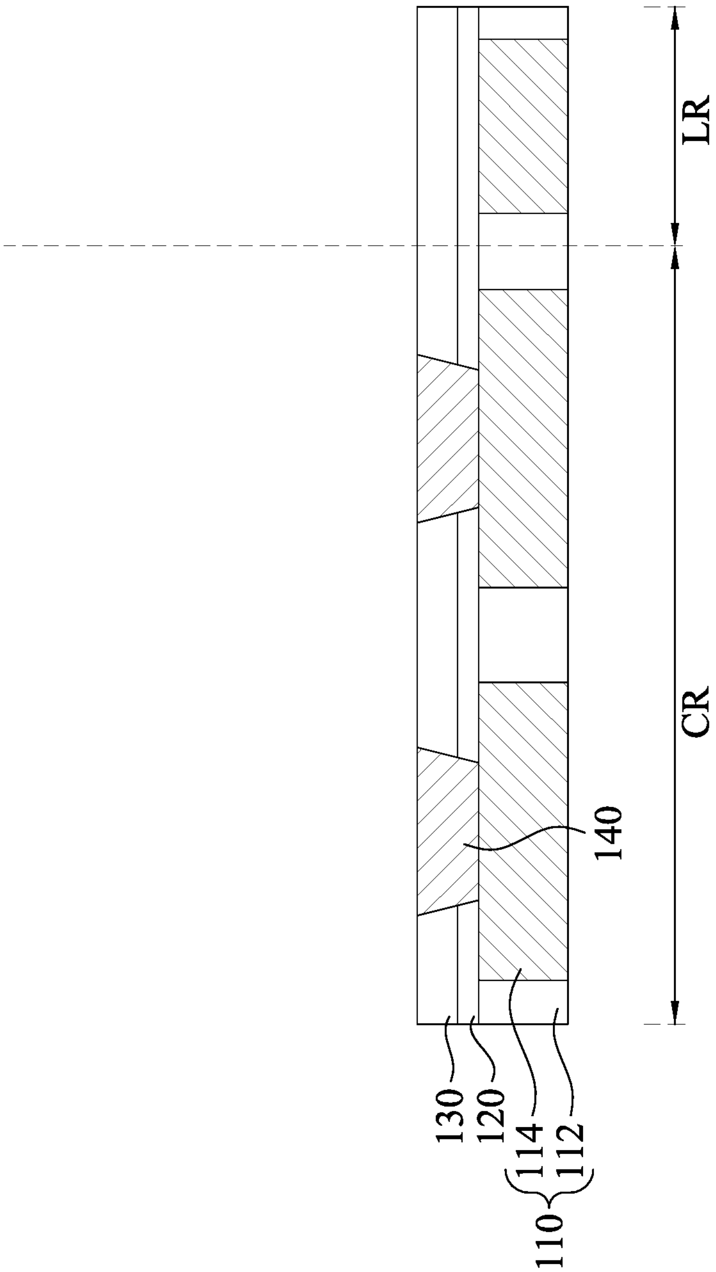

Reference is then made to FIG. 3. Bottom electrode vias (BEVA) 140 are formed within the first dielectric layer 120 and the second dielectric layer 130. In some embodiments, the method of forming the bottom electrode vias 140 includes etching the first dielectric layer 120 and the second dielectric layer 130 to form openings on the cell region CR of the substrate 110, and then filling conductive materials into the openings to form the bottom electrode vias 140. In some embodiments, a planarization process, such as a CMP process, may be performed to remove excess materials. The bottom electrode vias 140 are in contact with the conductive features 114 over the cell region CR. In some embodiments, the bottom electrode vias 140 may be made of metal, such as tungsten (W), cobalt (Co), ruthenium (Ru), aluminum (Al), copper (Cu), or other suitable materials. In some embodiments, the bottom electrode vias 140 and the conductive features 114 include different materials. For example, the bottom electrode vias 140 are made of titanium, while the conductive features 114 are made of copper.

In some embodiments, at least one of the bottom electrode vias 140 is a multi-layered structure and includes, for example, a diffusion barrier layer and a filling metal structure filling a recess in the diffusion barrier layer. In some embodiments, the bottom electrode vias 140 are electrically connected to an underlying electrical component, such as a transistor, through the conductive feature 114. In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or combinations thereof. In some embodiments, the filling metal structure is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using a CVD process, a PVD process, an ALD process, the like, and/or combinations thereof.

Figure 4:
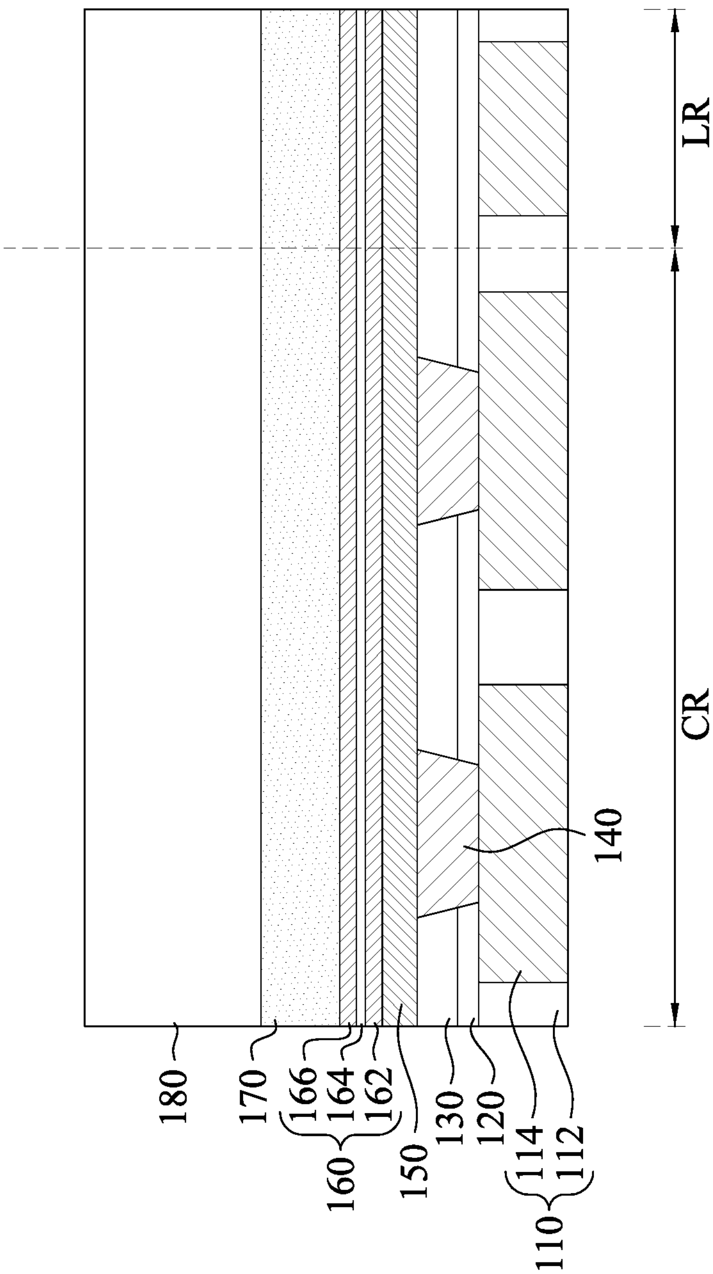

Reference is made to FIG. 4. A blanket bottom electrode layer 150 is conformally formed over the structure of FIG. 3. In greater details, the bottom electrode layer 150 is conformally formed over the bottom electrode vias 140 and the second dielectric layer 130, so that the bottom electrode layer 150 extends along top surfaces of the bottom electrode vias 140 and of the second dielectric layer 130. The bottom electrode layer 150 can be a single-layered structure or a multi-layered structure. The bottom electrode layer 150 includes a material the same as the bottom electrode vias 140 in some embodiments. In some other embodiments, the bottom electrode layer 150 includes a material different from the bottom electrode vias 140. In some embodiments, the bottom electrode layer 150 is titanium (Ti), tantalum (Ta), platinum (Pt), ruthenium (Ru), tungsten (W), aluminum (Al), copper (Cu), titanium nitride (TiN), tantalum nitride (TaN), the like, and/or combinations thereof. The bottom electrode layer 150 may be formed by a CVD process, a PVD process, an ALD process, the like, and/or combinations thereof.

A memory material layer 160 is formed over the bottom electrode layer 150. In some embodiments, the memory material layer 160 is a magnetic tunnel junction (MTJ) structure. To be specific, the memory material layer 160 includes a first magnetic layer 162, a tunnel barrier layer 164 and a second magnetic layer 166 are formed in sequence over the bottom electrode layer 150. The magnetic moment of the second magnetic layer 166 may be programmed causing the resistance of the resulting MTJ cell to be changed between a high resistance and a low resistance.

In some embodiments, the first magnetic layer 162 includes an anti-ferromagnetic material (AFM) layer over the bottom electrode layer 150 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), OsMn, combinations thereof, or the like. Some exemplary formation methods of the AFM layer include sputtering, PVD, ALD, or the like.

The ferromagnetic pinned layer in the first magnetic layer 162 forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the memory material layer 160. In certain embodiments, the ferromagnetic pinned layer includes cobalt-iron-boron (CoFeB). In some embodiments, the ferromagnetic pinned layer includes CoFeTa, NiFe, Co, CoFe, CoPt, the alloy of Ni, Co, and/or Fe, combinations thereof, or the like. Some exemplary formation methods of the ferromagnetic pinned layer include sputtering, PVD, ALD, thermal, e-beam evaporated deposition, or other suitable processes. In some embodiments, the ferromagnetic pinned layer includes a multilayer structure.

The tunnel barrier layer 164 is formed over the first magnetic layer 162. The tunnel barrier layer 164 can also be referred to as a tunneling layer, which is thin enough that electrons are able to tunnel through the tunnel barrier layer 164 when a biasing voltage is applied to a resulting resistance switching element fabricated from the memory material layer 160. In some embodiments, the tunnel barrier layer 164 includes magnesium oxide (MgO). In some other embodiments, the tunnel barrier layer 164 includes aluminum oxide ($Al_2O_3$), aluminum nitride (AlN), aluminum oxynitride (AlON), hafnium oxide ($HfO_2$), or zirconium oxide ($ZrO_2$), combinations thereof, or the like. An exemplary formation method of the tunnel barrier layer 164 includes sputtering, PVD, ALD, e-beam, thermal evaporated deposition, or the like.

The second magnetic layer 166 is formed over the tunnel barrier layer 164. The second magnetic layer 166 is a ferromagnetic free layer in some embodiments. A direction of a magnetic moment of the second magnetic layer 166 is not pinned because there is no anti-ferromagnetic material in the second magnetic layer 166. Therefore, the magnetic orientation of the second magnetic layer 166 is adjustable, thus the second magnetic layer 166 is referred to as a free layer. In some embodiments, the direction of the magnetic moment of the second magnetic layer 166 is free to rotate parallel or anti-parallel to the pinned direction of the magnetic moment of the ferromagnetic pinned layer in the first magnetic layer 162. The second magnetic layer 166 may include a ferromagnetic material similar to the material in the ferromagnetic pinned layer in the first magnetic layer 162. Since the second magnetic layer 166 has no anti-ferromagnetic material while the first magnetic layer 162 has an anti-ferromagnetic material therein, the first magnetic layer 162 and second magnetic layer 166 have different materials. In certain embodiments, the second magnetic layer 166 includes cobalt, nickel, iron or boron, compound or alloy thereof, or the like. Some exemplary formation methods of the second magnetic layer 166 include sputtering, PVD, ALD, e-beam or thermal evaporated deposition, or the like.

A top electrode layer 170 is conformally formed over the memory material layer 160. In greater details, the top electrode layer 170 covers the memory material layer 160. In some embodiments, the top electrode layer 170 includes tungsten (W). In some other embodiments, the top electrode layer 170 includes copper (Cu), aluminum (Al), tantalum (Ta), tantalum nitride (TaN), titanium, titanium nitride (TiN), the like, and/or combinations thereof. In some embodiments, the top electrode layer 170 is similar to the bottom electrode layer 150 in terms of composition. In some embodiments, the top electrode layer 170 is formed by a CVD process, a PVD process, an ALD process, the like, and/or combinations thereof.

A hard mask layer 180 is formed over the top electrode layer 170. In some embodiments, the hard mask layer 180 is formed from a dielectric material. For example, the hard mask layer 180 includes silicon carbide (SiC), silicon oxynitride (SiON), silicon nitride (SiN), silicon dioxide ($SiO_2$), amorphous carbon, (i.e., ARD), the like, and/or combinations thereof. In some embodiments, the hard mask layer 180 is formed from a conductive material. The hard mask layer 180 may be formed by acceptable deposition techniques, such as CVD, ALD, PVD, the like, and/or combinations thereof.

Figure 5:
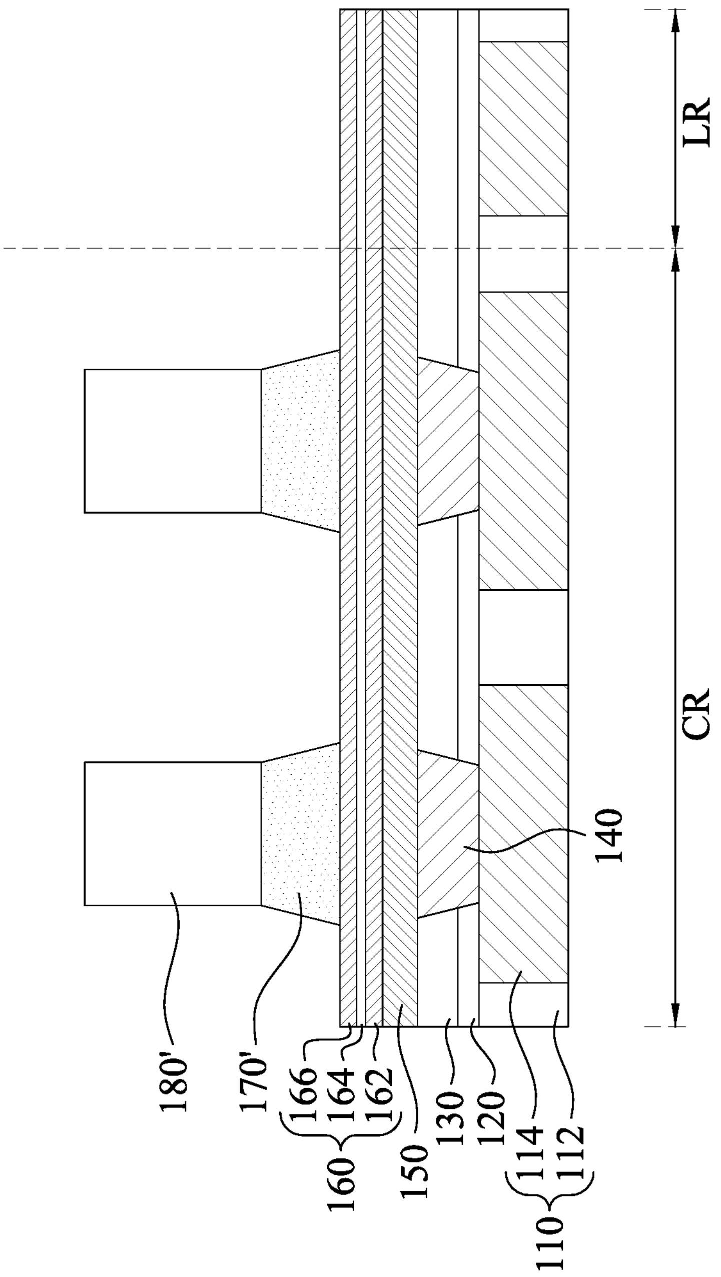

Reference is made to FIG. 4 and FIG. 5. A resist layer is formed over the hard mask layer 180 and then patterned into a patterned resist mask using a suitable photolithography process, such that portions of the hard mask layer 180 are exposed by the patterned resist mask. In some embodiments, the resist layer is a photoresist. In some embodiments, the patterned resist mask is an asking removable dielectric (ARD), which is a photoresist-like material generally having the properties of a photoresist and amendable to etching and patterning like a photoresist. Some exemplary photolithography processes may include photoresist coating (e.g., spin-on coating), soft baking, mask aligning, exposure, post-exposure baking, developing the photoresist, rinsing, drying (e.g., hard baking), other suitable processes, or combinations thereof.

An etching process is performed to remove portions of the hard mask layer 180 and the underlying top electrode layer 170 not protected by the patterned resist mask. The etching process stops when the second magnetic layer 166 of the memory material layer 160 is reached. The hard mask layer 180 and the underlying top electrode layer 170 may be etched using acceptable etching techniques, such as by using an anisotropic etching process. In some embodiments, the memory material layer 160 may has a higher etch resistance to the etching process than that of the top electrode layer 170. After the removal, top electrodes 170' and hard mask covers 180' are remained, and the second magnetic layer 166 of the memory material layer 160 is exposed, as shown in FIG. 5. The patterned resist mask is removed using, for example, an ashing process, after the etching process.

Figure 6:
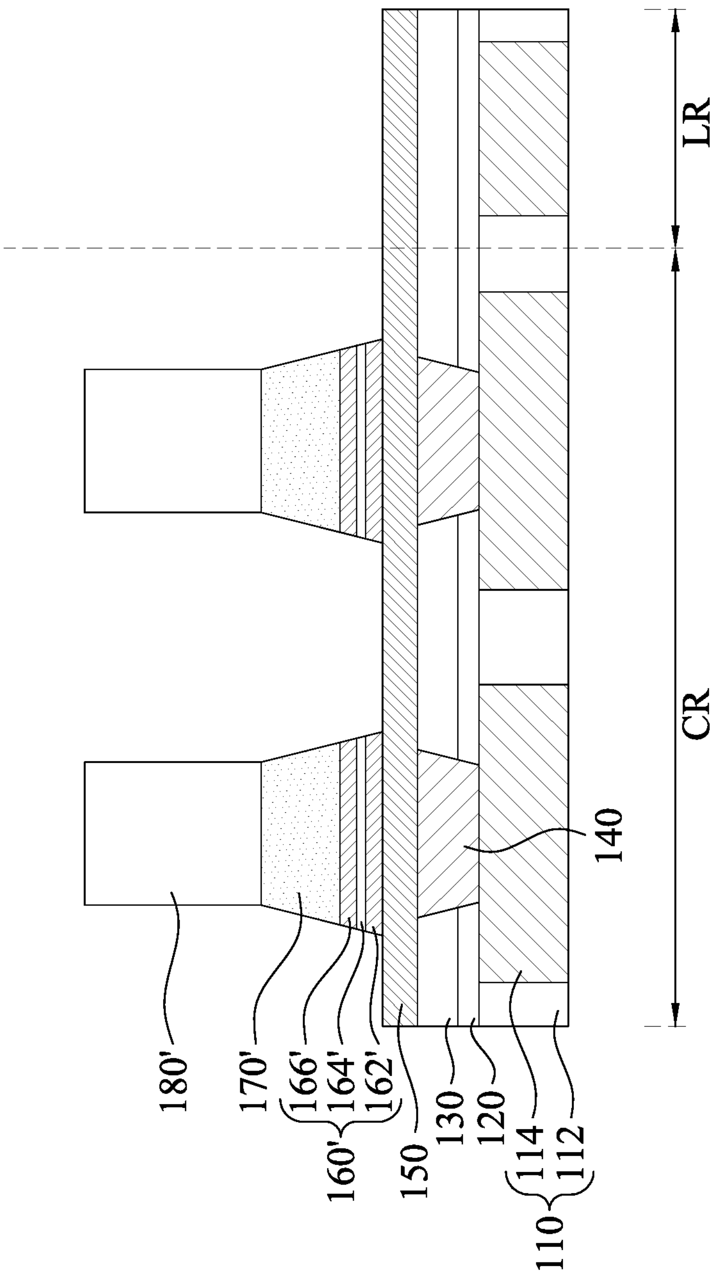

Reference is then made to FIG. 5 and FIG. 6. An etching process is performed to remove exposed portions of the memory material layer 160 (i.e., the second magnetic layer 166, the underlying tunnel barrier layer 164, and the underlying first magnetic layer 162) not protected by the top electrodes 170' and the hard mask covers 180'. The etching process stops when the bottom electrode layer 150 is reached. The memory material layer 160 may be etched using acceptable etching techniques, such as by using an anisotropic etching process. After the etching process, memory layers 160' (including second magnetic structures 166', underlying tunnel barrier structures 164', and underlying first magnetic structures 162') are remained, and the bottom electrode layer 150 is exposed, as shown in FIG. 6.

Figure 7:
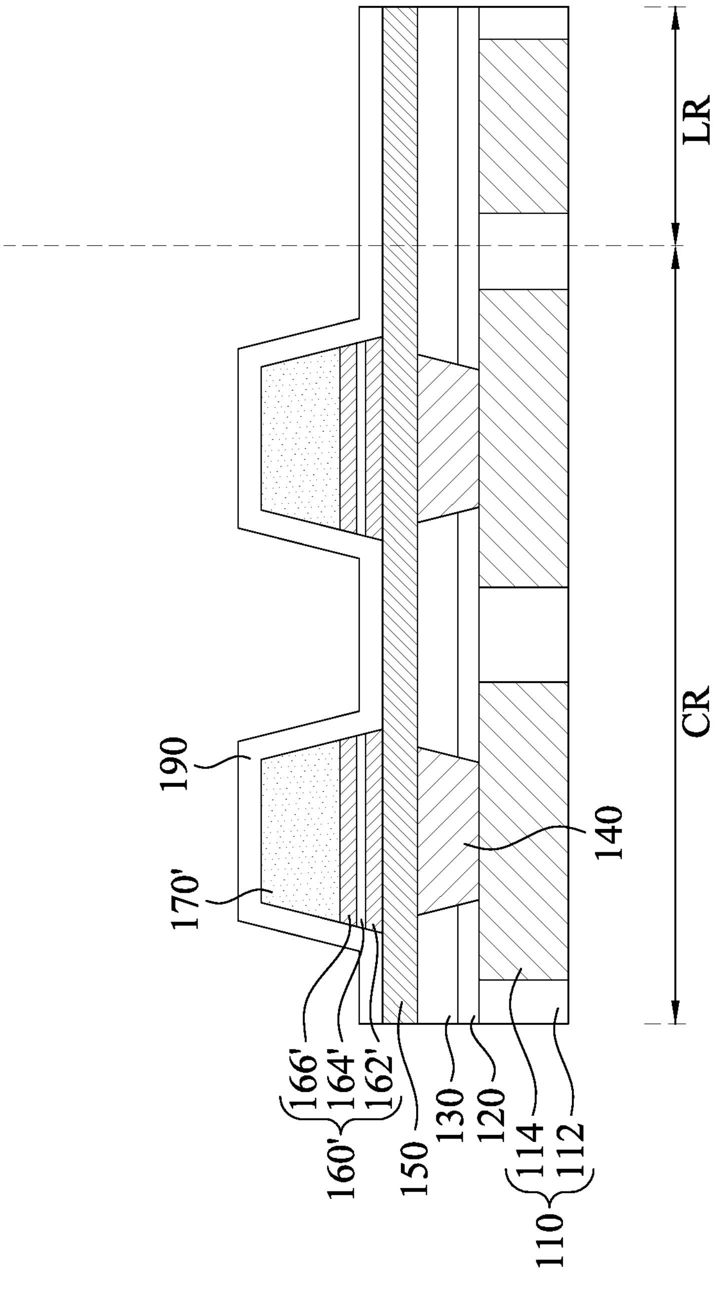

Reference is then made to FIG. 6 and FIG. 7. The hard mask covers 180' are removed. In some embodiments, removing the hard mask covers 180' may be performed by using an etching process or other suitable processes.

Thereafter, a first spacer layer 190 is conformally formed over the bottom electrode layer 150, along sidewalls of the memory layer 160', and over the top electrodes 170'. In other words, the first spacer layer 190 covers the sidewalls and top surfaces of the top electrodes 170'. In some embodiments, the first spacer layer 190 includes silicon nitride. In some other embodiments, the first spacer layer 190 includes silicon oxide, silicon carbide nitride (SiCN), silicon oxynitride (SiON), silicon carbide oxynitride (SiCON), or other suitable dielectric material. The first spacer layer 190 may be formed by a deposition process, such as a CVD, an ALD, a PVD, the like, and/or combinations thereof.

Figure 8:
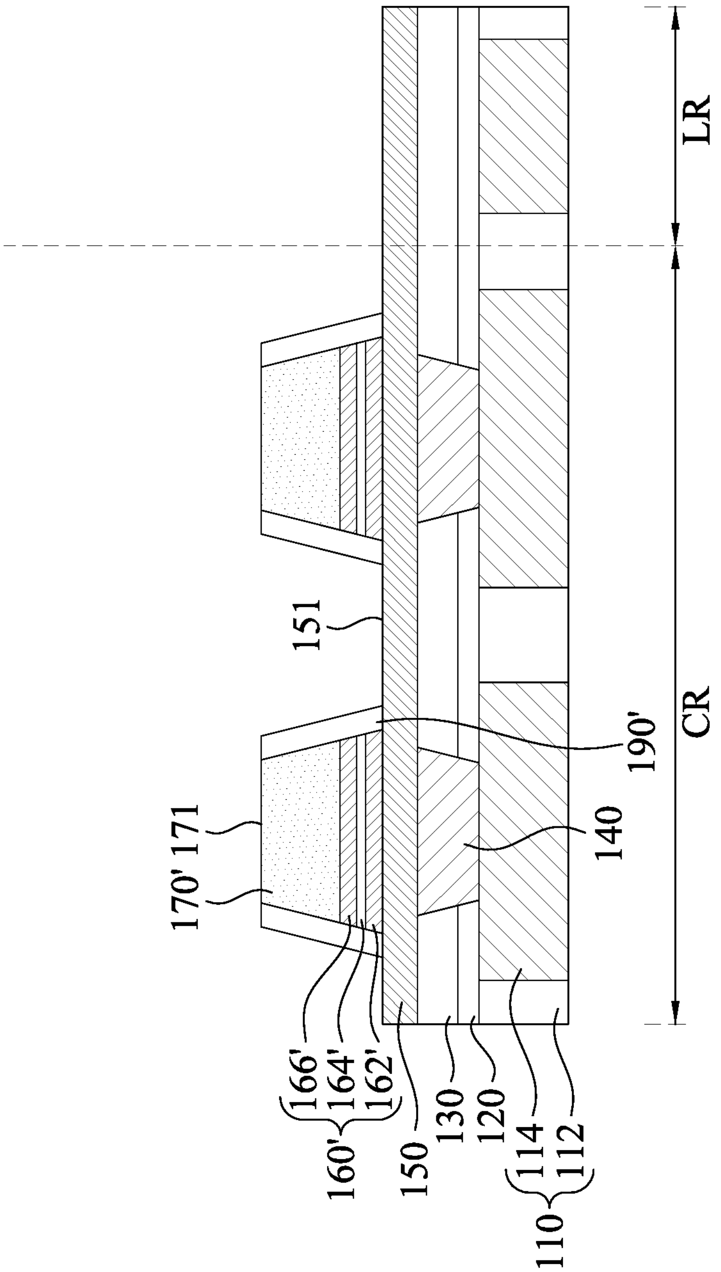

Reference is then made to FIG. 7 and FIG. 8. An etching process is performed to remove horizontal portions of the first spacer layer 190. After the removal, first spacers 190' (i.e., vertical portions of the first spacer layer 190) are remained, and top surfaces 171 of the top electrodes 170' and a top surface 151 of the bottom electrode layer 150 are exposed, as shown in FIG. 8.

Figure 9:
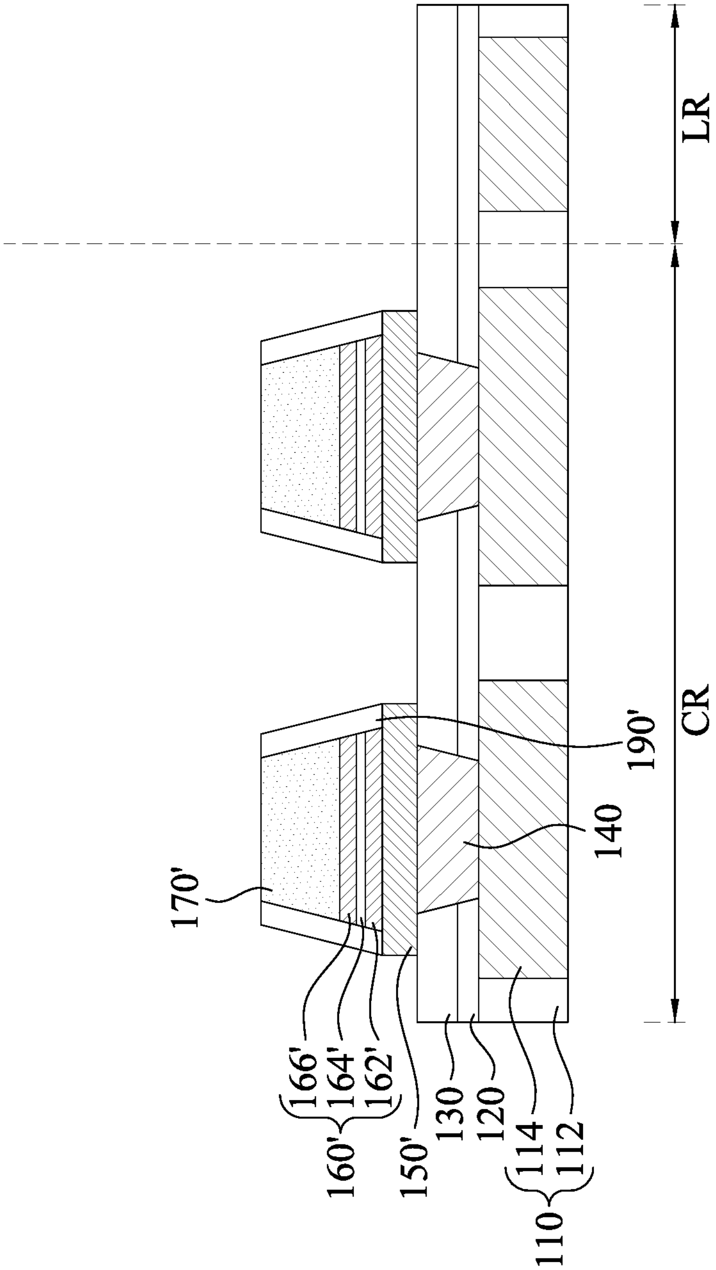

Reference is then made to FIG. 8 and FIG. 9. An etching process is performed to remove exposed portions of the bottom electrode layer 150 not protected by the memory layer 160', the top electrodes 170', and the first spacers 190'. The etching process stops when the second dielectric layer 130 is reached since the second dielectric layer 130 may have a higher etch resistance to the etching process than that of the bottom electrode layer 150. The bottom electrode layer 150 may be etched using acceptable etching techniques, such as by using an anisotropic etching process. After the etching process, bottom electrodes 150' are remained, and the second dielectric layer 130 is exposed, as shown in FIG. 9. In some embodiments, the first spacers 190' are formed such that a sidewall of each of the bottom electrodes 150' is free of the first spacers 190'.

Figure 10:
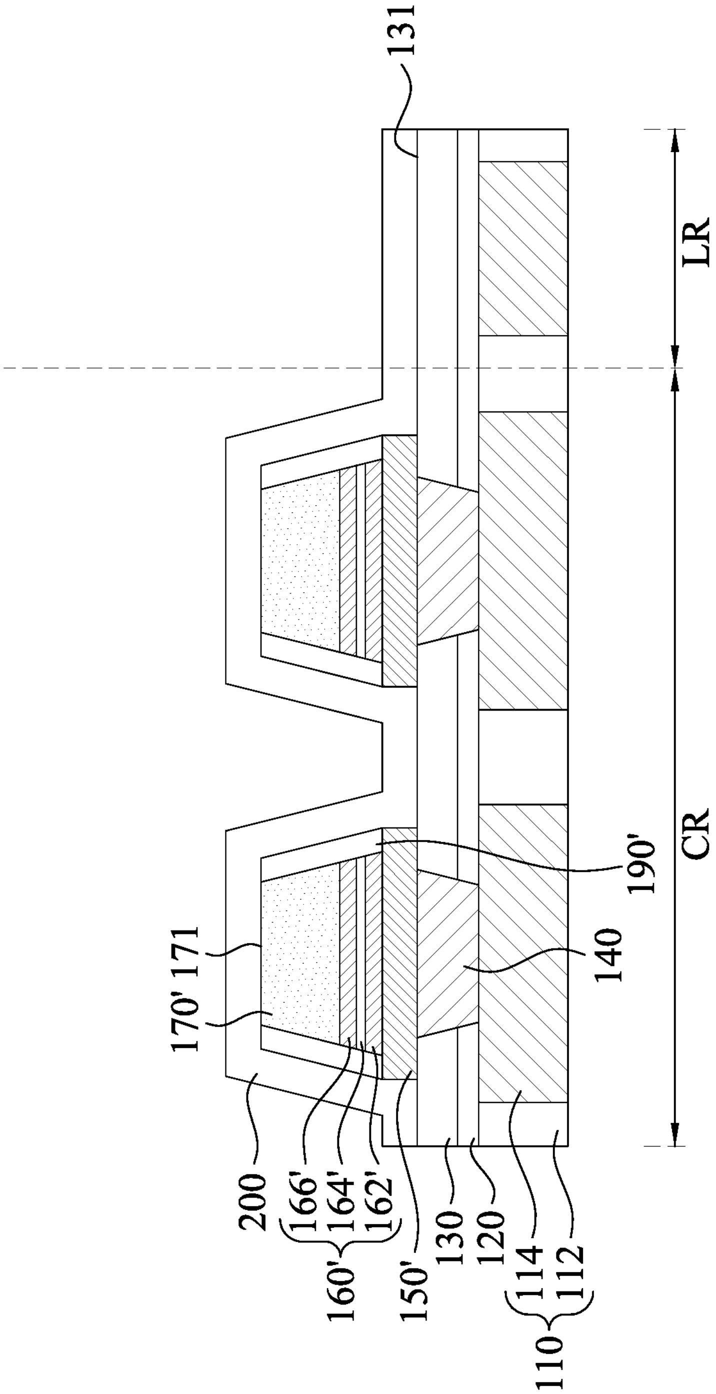

Reference is then made to FIG. 9 and FIG. 10. A second spacer layer 200 is conformally formed over the structure of FIG. 9. In greater details, the second spacer layer 200 is formed over the second dielectric layer 130, over the top electrodes 170', along sidewalls of the bottom electrodes 150', and along sidewalls of the first spacers 190'. In other words, the second spacer layer 200 covers the top surfaces 171 of the top electrodes 170' and a top surface 131 of the second dielectric layer 130. In some embodiments, the second spacer layer 200 includes dielectric materials. In some embodiments, the second spacer layer 200 includes silicon oxide, silicon nitride, silicon carbide nitride (SiCN), silicon oxynitride (SiON), silicon carbide oxynitride (SiCON), or other suitable dielectric material. The first spacers 190' and the second spacer layer 200 may include different materials. For example, the first spacers 190' include silicon nitride, and the second spacer layer 200 includes silicon oxide. The second spacer layer 200 may be formed by a deposition process, such as a CVD, an ALD, a PVD, the like, and/or combinations thereof.

Figure 11:
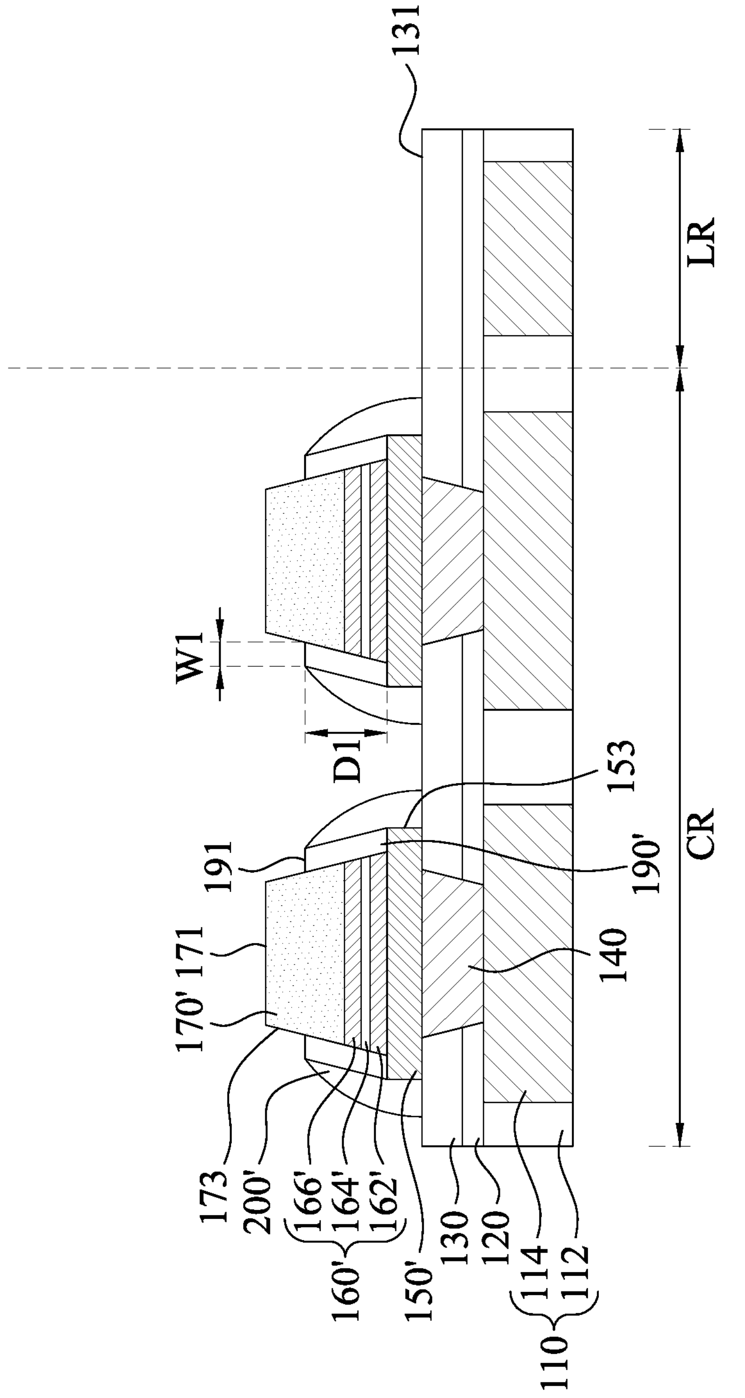

Reference is then made to FIG. 10 and FIG. 11. An etching process is performed to remove portions of the first spacers 190' and portions of the second spacer layer 200. After the removal, second spacers 200' are remained, and top surfaces 191 of the first spacers 190' are lower than the top surfaces 171 of the top electrodes 170'. Further, the etching process exposes the top surfaces 171 of the top electrodes 170', a portion of the sidewalls 173 of the top electrodes 170', and the top surface 131 of the second dielectric layer 130. In some embodiments, the first spacers 190' and the second spacers 200' have different profiles. The second spacers 200' have curved outer sidewalls covering sidewalls of the first spacers 190'.

In some embodiments, a depth D1 of each of the first spacers 190' is greater than a thickness of the memory layer 160'. In some embodiments, the depth D1 of each of the first spacers 190' is in a range of about 250 angstroms (Å) to about 300 angstroms. If the depth D1 of each of the first spacers 190' is less than about 250 angstroms, the memory layer 160' may be damaged by subsequent etching processes (e.g., etching process in FIG. 12); if the depth D1 of each of the first spacers 190' is greater than about 300 angstroms, a residue of the top electrodes 170' may be adversely remained by subsequent etching processes (e.g., the etching process in FIG. 12), thereby adversely affecting performance of the memory device.

In some embodiments, a ratio of the depth D1 to a width W1 of each of the first spacers 190' is in a range of about 2.9 to about 3.5. As such, the first spacers 190' can have a lower aspect ratio which is beneficial for the subsequent etching processes (e.g., the etching process in FIG. 12). For example, the upper limit (i.e., about 3.5) of the ratio of the first spacers 190' prevents the first spacers 190' from collapsing in the subsequent etching processes (e.g., the etching process in FIG. 12), and the lower limit (i.e., about 2.9) of the ratio of the first spacers 190' permits a reasonable size of the memory cells M (see FIG. 12). Thus, the performance of the memory device can be improved. In some embodiments, the width W1 of each of the first spacers 190' is in a range of about 80 angstroms to about 90 angstroms.

In some embodiments, the second spacers 200' covers (and/or is in contact with) a sidewall 153 of each of the bottom electrodes 150'. The second spacers 200' can protect the bottom electrodes 150' and prevent the conductive materials (e.g., top electrode vias 264 in FIG. 19 or FIG. 20) from being electrically connected to the bottom electrodes 150'.

In some embodiments, the etching process is a selectively etching process which etches dielectric material (e.g., the first spacers 190' and the second spacer layer 200) at a higher etching rate than etches metal materials (e.g., the top electrodes 170'). As such, the top electrodes 170' protrude from the first spacers 190' and the second spacers 200'. In some embodiments, the etching process may use dry etching. The process gas of dry etching may include fluorine-containing gases. Diluting gases such as $N_2$, $O_2$, or Ar may optionally be used.

Figure 12:
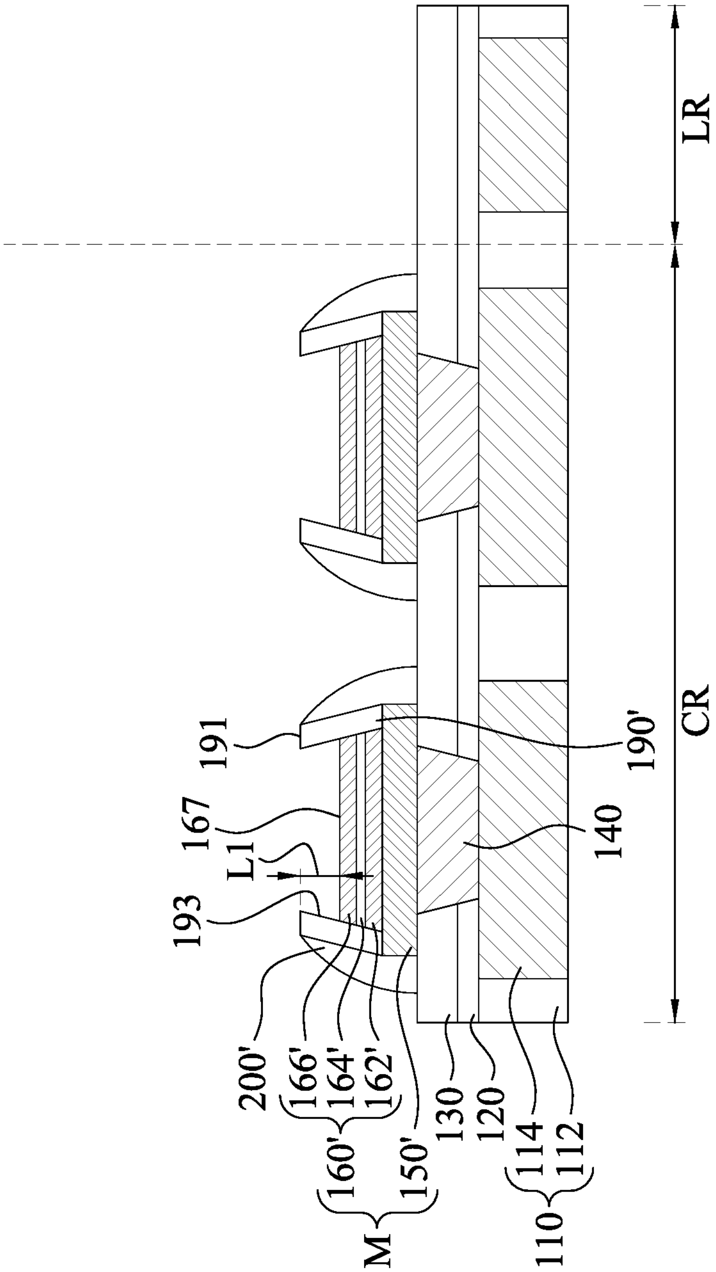

Reference is then made to FIG. 11 and FIG. 12. An etching process is performed to remove the top electrodes 170'. A distance L1 between the top surface 191 of the first spacer 190' and the top surface 167 of the memory layer 160' is in a range of about 10 angstroms to about 50 angstroms. The distance L1 may be referred as a depth of a recess surrounded by the first spacer 190' and the memory layer 160'. As such, memory cells M are formed. Each of the memory cells M includes the bottom electrode 150' and the memory layer 160'. In some embodiments, each of the memory cells M includes the bottom electrode 150', the memory layer 160', and the first spacer 190'. In some embodiments, each of the memory cells M further includes the memory cells M includes the bottom electrode 150', the memory layer 160', the first spacer 190', and the second spacer 200'. After the removal, a top surface 167 of the second magnetic structure 166' of the memory layer 160' and an inner sidewall 193 of the first spacer 190' above the memory layer 160' are exposed. Since the distance L1 is in a range of about 10 angstroms to about 50 angstroms, the top electrodes 170' can be removed without leaving residues on the memory layer 160'.

In some embodiments, the etching process of removing the top electrodes 170' can improve process window (e.g., process window can be enlarged) for following processes. In some embodiments, the etching process is a selectively etching process which etches metal materials (e.g., the top electrodes 170') at a higher etching rate than etches dielectric material (e.g., the first spacers 190' and the second spacer layer 200). As such, the first spacers 190' and the second spacers 200' protrude from the memory layer 160'. In some embodiments, the etching process may use wet etching. The etching solution (etchant) may include $NH_4OH:H_2O_2:H_2O$ (APM), $NH_2OH$, KOH, $HNO_3:NH_4F:H_2O$, and/or the like.

Figure 13:
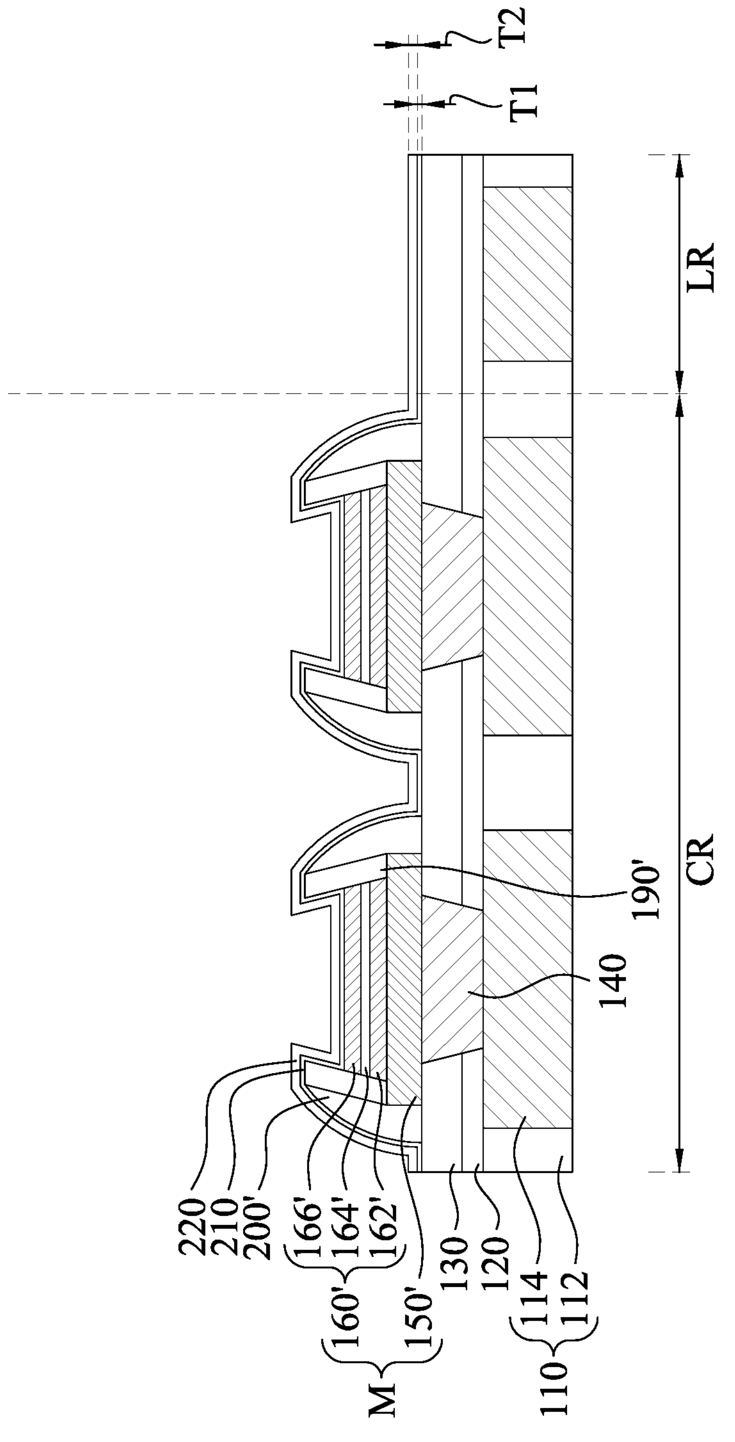

Reference is then made to FIG. 12 and FIG. 13. An etch stop layer 210 is conformally formed over the structure of FIG. 12. In greater details, the etch stop layer 210 covers the second dielectric layer 130, the memory layer 160', the first spacers 190', and the second spacers 200'. The etch stop layer 210 may be referred as an etch stop layer for conductive via (e.g., top electrode vias in FIG. 19) landing. In some embodiments, the etch stop layer 210 includes metal oxide, such as aluminum oxide. In some embodiments, the etch stop layer 210 can be a high-κ dielectric layer having a dielectric constant (κ) higher than the dielectric constant of $SiO_2$, i.e. κ>3.9. The etch stop layer 210 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), or other suitable materials. The etch stop layer 210 can be formed using plasma enhanced CVD (PECVD), however, other suitable methods, such as low pressure CVD (LPCVD), atomic layer deposition (ALD), and the like, can also be used. In some embodiments, the etch stop layer 210 has a thickness T1 in a range of about 10 angstroms (Å) to about 50 angstroms.

After the etch stop layer 210 is formed, a protective layer 220 is formed over the etch stop layer 210. The protective layer 220 can protect the underlying etch stop layer 210 from being damaged. In some embodiments, the protective layer 220 includes dielectric materials, such as oxide (e.g., silicon oxide), nitride (e.g., silicon nitride), oxynitride (e.g., silicon oxynitride), combinations thereof, or the like. In some other embodiments, the protective layer 220 is made of low-k dielectric material, such as tetraethylorthosilicate (TEOS)-formed oxide, or other suitable materials. The protective layer 220 may be formed by ALD, such as plasma enhanced ALD (PEALD), CVD, PECVD, flowable CVD (FCVD), or other suitable methods.

Figure 14:
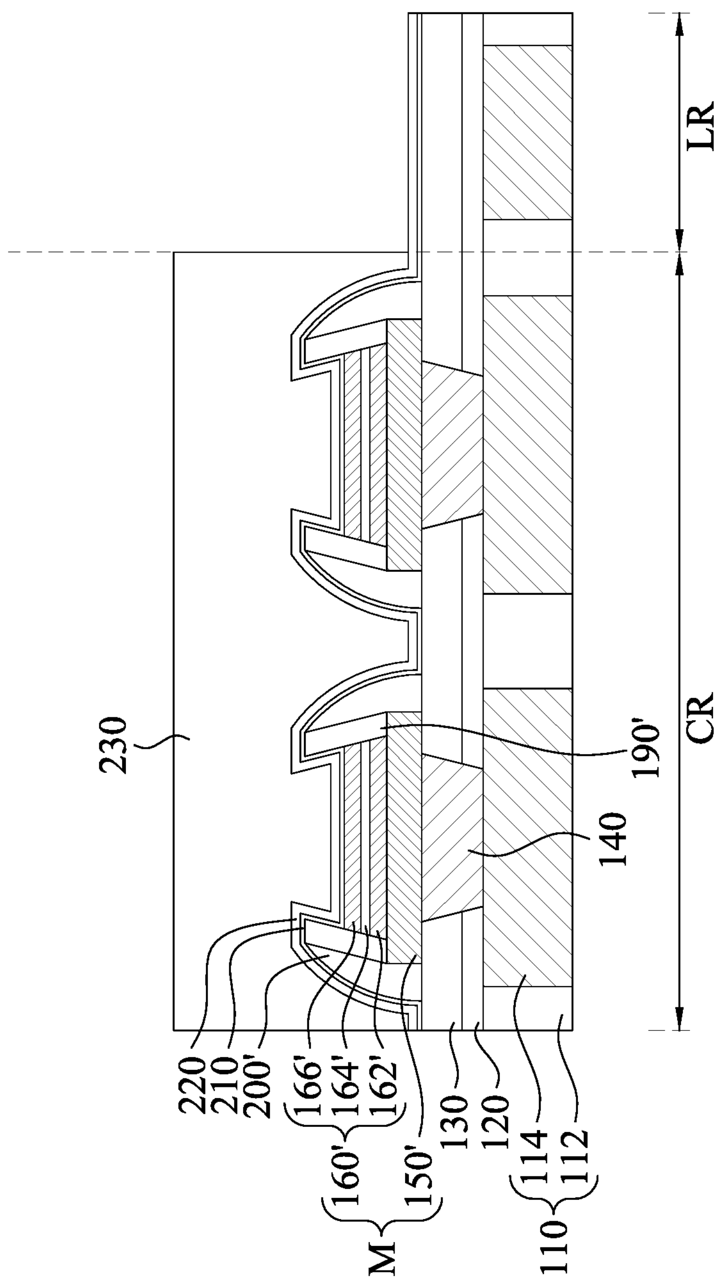

Reference is then made to FIG. 14. A patterned mask 230 is formed over the cell region CR of the substrate 110. In other words, a portion of the protective layer 220 over the cell region CR of the substrate 110 are covered by the patterned mask 230, while the other portions of the protective layer 220 over the logic region LR of the substrate 110 are exposed. In some embodiments, a mask material may be formed over the portion of the protective layer 220 over the cell region CR of the substrate 110 by using spin-coating or other suitable techniques, and the mask material is patterned to be the patterned mask 230. In some embodiments, the patterned mask 230 is a photoresist, a hard mask layer, a $SIN_x$ layer, or combinations thereof.

Figure 15:
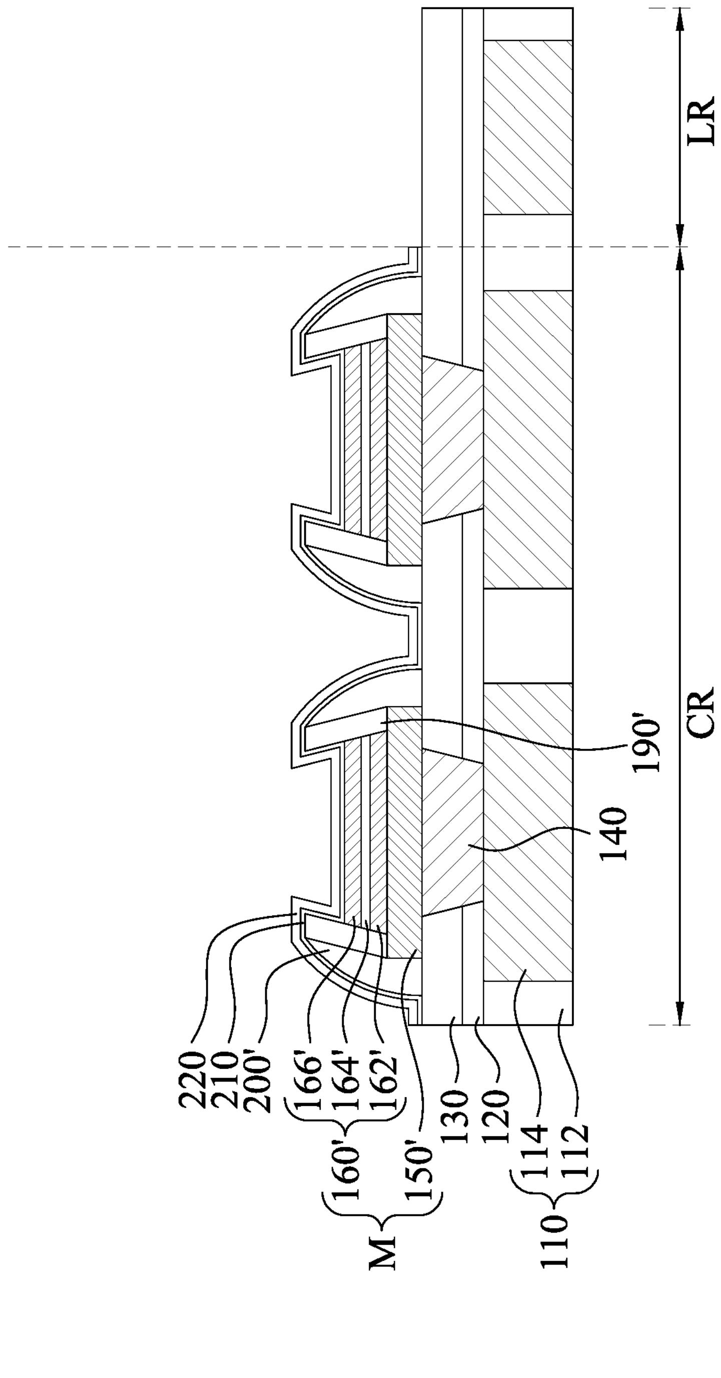

Reference is then made to FIG. 14 and FIG. 15. The etch stop layer 210 and the protective layer 220 are etched by using the patterned mask 230 as an etch mask. As a result, the etch stop layer 210 and the protective layer 220 over the logic region LR of the substrate 110 are removed, leaving the etch stop layer 210 and the protective layer 220 over the cell region CR are remained. The etch stop layer 210 and the protective layer 220 over the logic region LR of the substrate 110 are removed to open the logic region LR and thus conducive vias (e.g., top electrode vias in FIG. 19) in subsequent processes can be electrically connected to the conductive feature 114 over the logic region LR. After the etching process, the etch stop layer 210 and the protective layer 220 are removed from the logic region LR. In other words, the etch stop layer 210 and the protective layer 220 are etched such that the logic region LR is free of the etch stop layer 210 and the protective layer 220.

In some embodiments, the second dielectric layer 130 has a higher etch resistance to the etching process than that of the etch stop layer 210 and the protective layer 220. An etch rate of the second dielectric layer 130 is slower than that of at least one of the etch stop layer 210 and the protective layer 220. Through the configuration, the etching process over the logic region LR stops at the second dielectric layer 130, and the first dielectric layer 120 is protected by the second dielectric layer 130 during the etching process.

After the etch stop layer 210 and the protective layer 220 are etched, the patterned mask 230 is removed by using stripping, ashing, or etching process (such as reactive ion etching (RIE), ion beam etching (IBE), wet etching, or combinations thereof).

Figure 16:
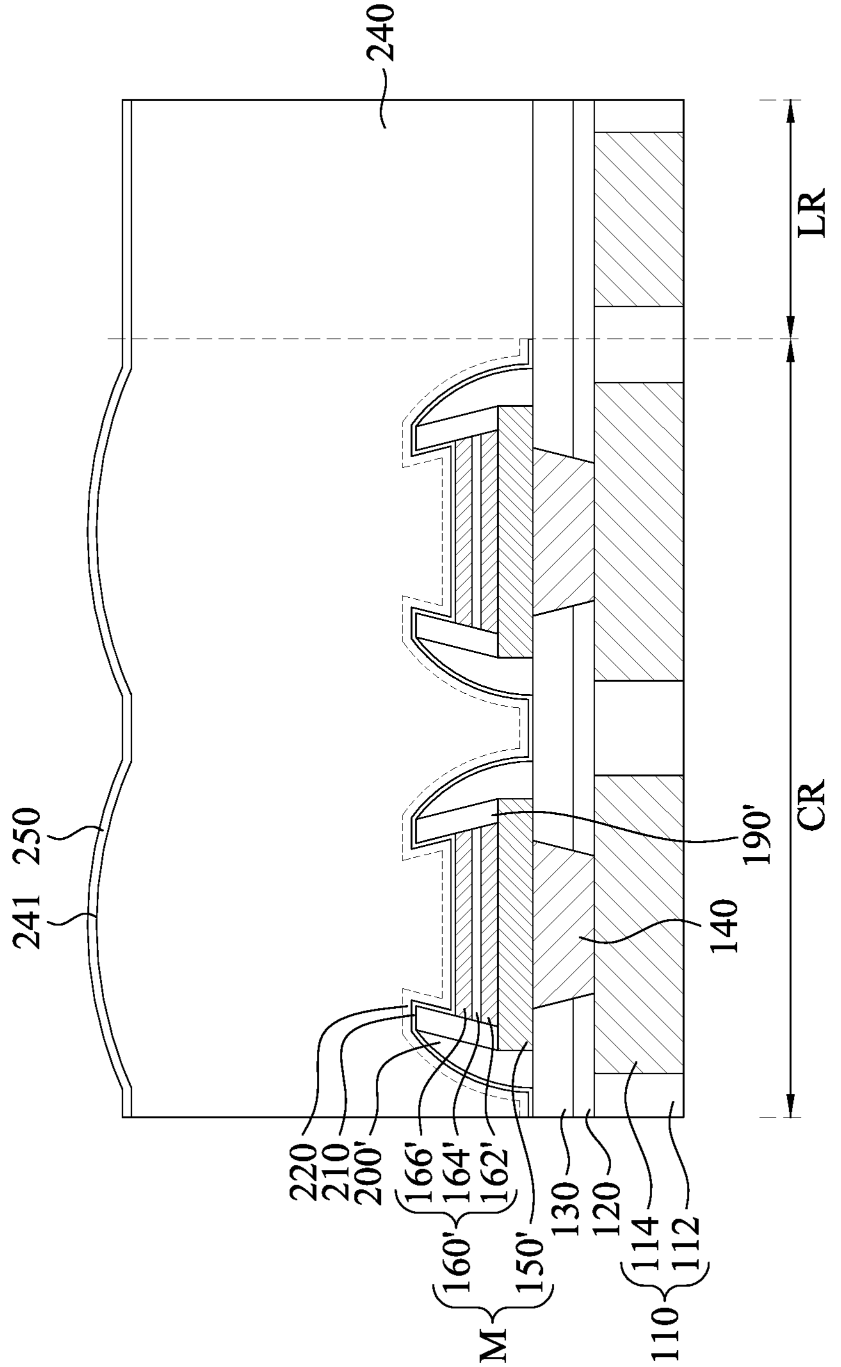

Reference is then made to FIG. 16. A third dielectric layer 240 is deposited over the structure of FIG. 15. In other words, the third dielectric layer 240 covers the protective layer 220 over the cell region CR of the substrate 110, and covers the second dielectric layer 130 over the logic region LR of the substrate 110. The third dielectric layer 240 may be a low-k dielectric layer made from extra low-k materials, extreme low-k materials, combinations thereof, or the like. In some embodiments, the third dielectric layer 240 has a dielectric constant lower than 2.4. In some embodiments, the third dielectric layer 240 includes silicon oxide, fluorinated silica glass (FSG), carbon doped silicon oxide, tetra-ethyl-ortho-silicate (TEOS)-formed oxide, phosphosilicate glass (PSG), borophosphosilicate glass (BPSG), black diamond, amorphous fluorinated carbon, the like, or combinations thereof. The third dielectric layer 240 may be formed by CVD, high-density plasma CVD, spin-on, sputtering, or other suitable methods.

In some embodiments, since the third dielectric layer 240 includes the same material as the protective layer 220, the protective layer 220 and the third dielectric layer 240 have no interface therebetween. In some embodiments, the third dielectric layer 240 may have the same material as the ILD layer 112. In some other embodiments, the third dielectric layer 240 may have a different material than the ILD layer 112.

In some embodiments, since the top electrode (e.g., top electrode 170' in FIG. 11) is removed, a step height from the bottom electrode via 140 to a top surface 241 of the third dielectric layer 240 can be improved (e.g., lower step height). As such, no void is formed between adjacent memory cells M, and the performance of the memory device can be improved.

After the third dielectric layer 240 is formed, a sacrificial layer 250 is formed over the third dielectric layer 240. The sacrificial layer 250 may include dielectric materials, e.g., silicon oxide layer, silicon nitride layer or silicon oxynitride layer, combinations thereof, or the like. The sacrificial layer 250 may be formed by CVD, plasma enhanced CVD (PECVD), ALD, flowable CVD (FCVD), or other suitable methods.

Figure 17:
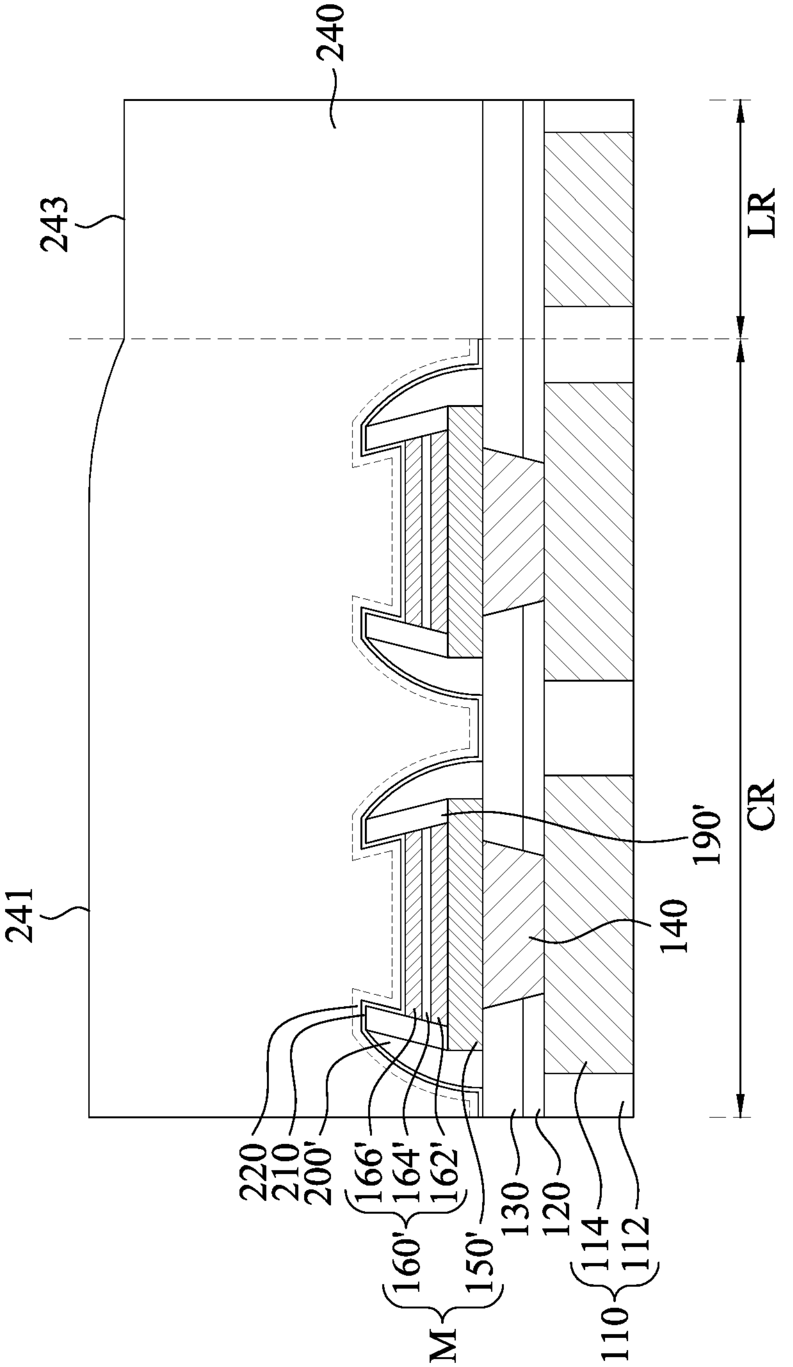

Reference is then made to FIG. 17. A planarization process is performed to remove the sacrificial layer 250 and a portion of the third dielectric layer 240. The top surface 241 of the third dielectric layer 240 over the cell region CR is higher than a top surface 243 of the third dielectric layer 240 over the logic region LR. In some embodiments, the planarization process is a chemical mechanical planarization (CMP) process.

Figure 18:
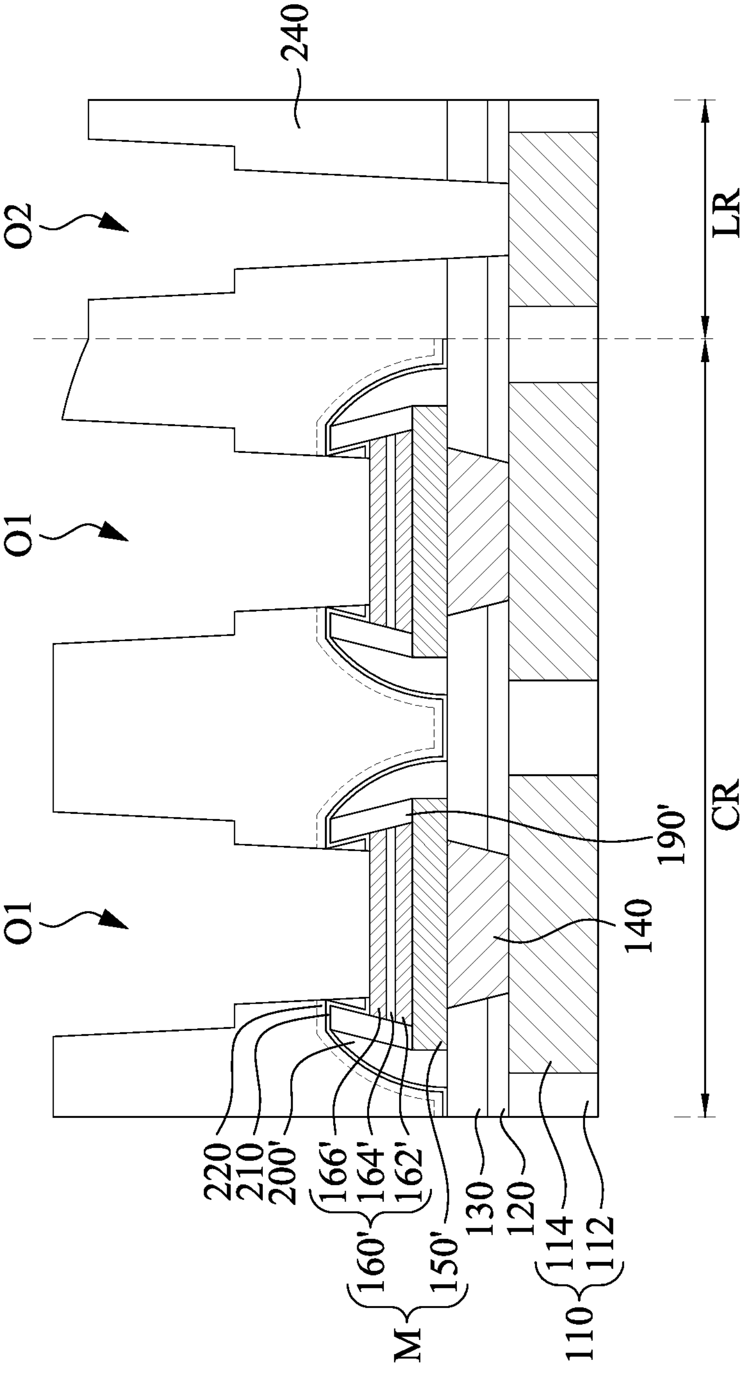

Reference is made to FIG. 18. An etching process is performed to form openings O1 and O2. The openings O1 are formed in the third dielectric layer 240 and expose the second magnetic structure 166' of the memory layer 160'. The opening O2 is formed in the first dielectric layer 120, the second dielectric layer 130, and third dielectric layer 240, and exposes the conductive feature 114 of the substrate 110.

In some embodiments, the etching process is a dual damascene process, which creates both trenches and via holes at once. For example, in FIG. 18, each of the openings O1 and O2 has a trench and a via hole under the trench. The via holes of the openings O1 expose the second magnetic structure 166' of the memory layer 160', and the via hole of the openings O2 exposes the conductive feature 114 over the logic region LR of the substrate 110.

Figure 19:
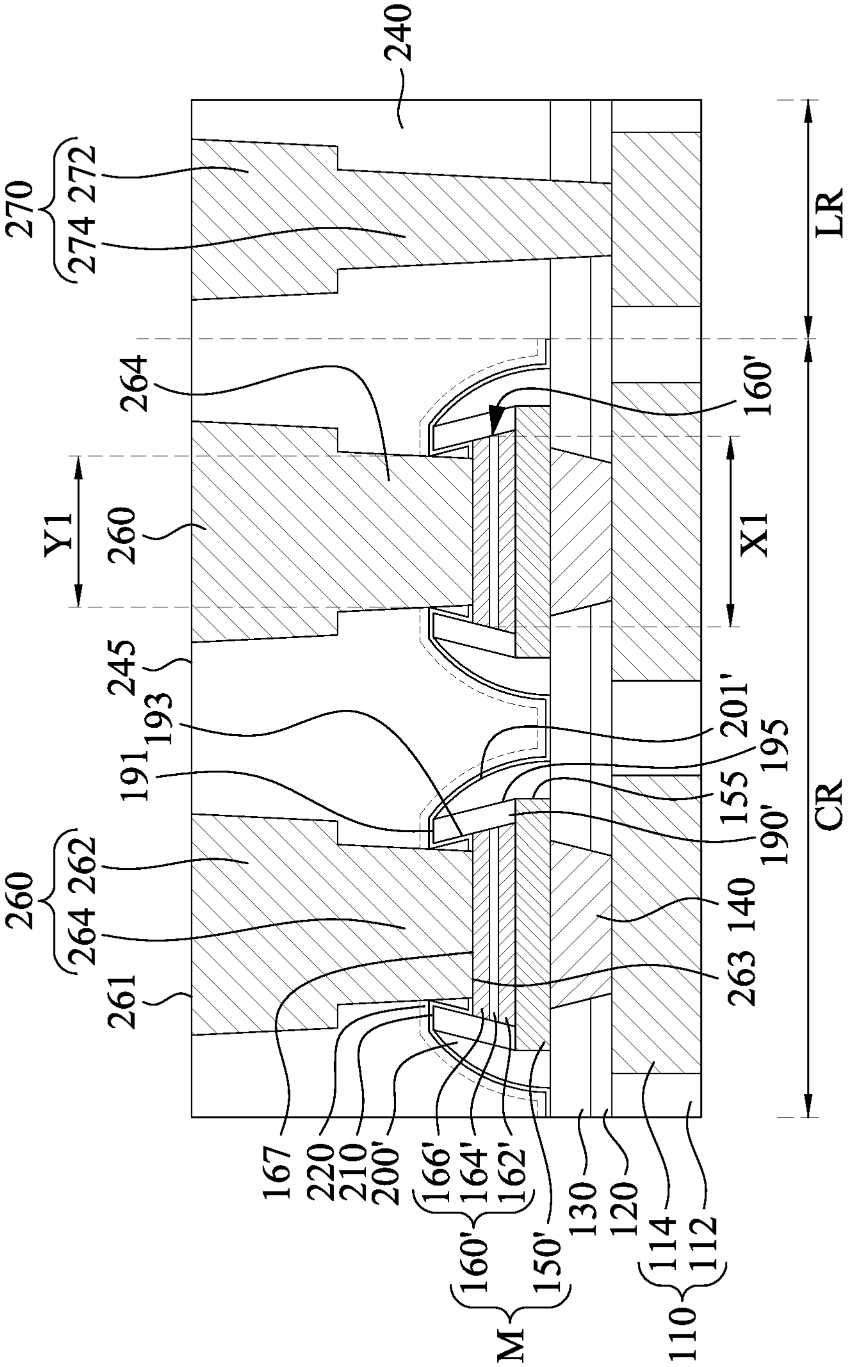

Reference is made to FIG. 18 and FIG. 19. A conductive material is filled in the openings O1 and O2 to form conductive features 260 and 270. Each of the conductive features 260 includes a top conductive line 262 and a top electrode via 264 between the top conductive line 262 and the memory layers 160'. The conductive feature 270 includes a conductive line 272 and a via 274 between the conductive line 272 and one of the conductive features 114. The conductive features 260 are electrically connected to the memory layer 160' over the cell region CR, and the conductive features 270 is electrically connected to the conductive feature 114 over the logic region LR. The conductive features 260 extend upward from the memory layer 160', and thus the process window can be enlarged. Further, the conductive features 260 can be formed aligned to the memory layer 160'. For example, a bottom surface of the conductive feature 260 overlaps with a top surface of the second magnetic structure 166' of the memory layer 160'.

In some embodiments, the conductive features 260 and 270 may be made of metal, such as tungsten (W), cobalt (Co), ruthenium (Ru), aluminum (Al), copper (Cu), or other suitable materials. After the deposition of the conductive material, a planarization process, such as a chemical mechanical planarization (CMP) process, may be then performed to remove excess conductive material outside the openings O1 and O2 to form the conductive features 260 and 270.

In some embodiments, the conductive features 260 are made of a material the same as the conductive features 114. In some embodiments, the conductive feature 270 is made of a material the same as the conductive features 114. For example, the conductive features 260, the conductive feature 270, and the conductive features 114 are made of copper.

In some embodiments, each of the conductive features 260 and the conductive feature 270 include a diffusion barrier layer and a filling layer over the barrier layer. In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or combinations thereof. In some embodiments, the filling metal is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using a CVD process, a PVD process, an ALD process, the like, and/or combinations thereof.

In some embodiments, each of the memory layers 160' has a width (i.e., critical dimension) X1, and each of the top electrode vias 264 of the conductive features 260 has a width (i.e., critical dimension) Y1, in which the width X1 is greater than the width Y1. As such, well overlay control can be achieved and the process window of the top electrode vias 264 can be improved. For example, a ratio of the width Y1 to the width X1 is in a range of about 0.6 to about 0.9.

In some embodiments, the memory device in FIG. 19 includes the substrate 110, the bottom electrode vias 140, a plurality of memory cells M, and the conductive features 260. The substrate 110 has the cell region CR and the logic region LR adjacent to (e.g., surrounding) the cell region CR. The substrate 110 includes the ILD layer 112 with the conductive features 114 over the logic region LR and the memory region CR. The bottom electrode vias 140 are disposed in the first dielectric layer 120 and the second dielectric layer 130, and the bottom electrode vias 140 are disposed over the cell region CR of the substrate 110. Each of the memory cells M includes a bottom electrode 150' and a memory layer 160'. The bottom electrodes 150' are disposed over and electrically connected to the bottom electrode vias 140, respectively. The memory layers 160' are disposed over the bottom electrodes 150', respectively. The conductive features 260 over the cell region CR are in contact with and directly electrically connected to the memory layers 160', respectively. The conductive feature 270 over the logic region LR is in contact with and electrically connected to the conductive feature 114.

In some embodiments, the memory device further includes the first spacers 190' over the bottom electrodes 150' and lining with the outer sidewalls of the memory layers 160'. The first spacers 190' extend upwards from the bottom electrodes 150' and the top surface 191 of each of the first spacers 190' is higher than the top surface 167 of each of the memory layers 160'. In other words, a bottom surface 263 of each of the conductive features 260 is lower than the top surface 191 of each of the first spacers 190'. In some embodiments, the memory device further includes the second spacers 200' over the second dielectric layer 130 and lining with outer sidewalls 155 of the bottom electrodes 150' and outer sidewalls 195 of the first spacers 190'. In some embodiments, the inner sidewalls 193 and the outer sidewalls of the first spacers 190' are in contact with the etch stop layer 210 and the second spacers 200', respectively. The second spacers 200' cover the bottom electrodes 150', thereby protecting the bottom electrodes 150' from being electrically connected to the conductive features 260. If the bottom electrodes 150' are electrically connected to the conductive features 260, the short problem would occur. In some embodiments, each of the second spacers 200' has a curved outer sidewall 201. The outer sidewall 201 of each of the second spacers 200' may be lower than the top surface 191 of each of the first spacers 190'. The bottom surface 263 of each of the conductive features 260 may be lower than a top of the outer sidewall 201 of each of the second spacers 200'.

In some embodiments, the memory device further includes the etch stop layer 210 covering the second dielectric layer 130 over the cell region CR, while a portion of the second dielectric layer 130 over the logic region LR is spaced apart from the etch stop layer 210. The etch stop layer 210 covers the inner sidewall 193 of the first spacers 190' and the second spacers 200'. In some embodiments, the etch stop layer 210 has a portion over the second magnetic structures 166' of the memory layers 160'. In other words, a portion of the top surface 167 of each of the second magnetic structures 166' of the memory layers 160' is covered by the etch stop layer 210, while the other portions of the top surface 167 of each of the second magnetic structures 166' of the memory layers 160' are covered by the conductive feature 260. In some embodiments, the memory device further includes the protective layer 220 over the etch stop layer 210.

In some embodiments, the memory device further includes the first dielectric layer 120 and the second dielectric layer 130 over the substrate. The first dielectric layer 120 and the second dielectric layer 130 surround the bottom electrode vias 140 over the cell region CR. In some embodiments, the memory device further includes the third dielectric layer 240 over the second dielectric layer 130. The third dielectric layer 240 surrounds the conductive features 260 and 270. A top surface 245 of the third dielectric layer 240 is substantially level with a top surface 261 of each of the conductive features 260.

Figure 20:
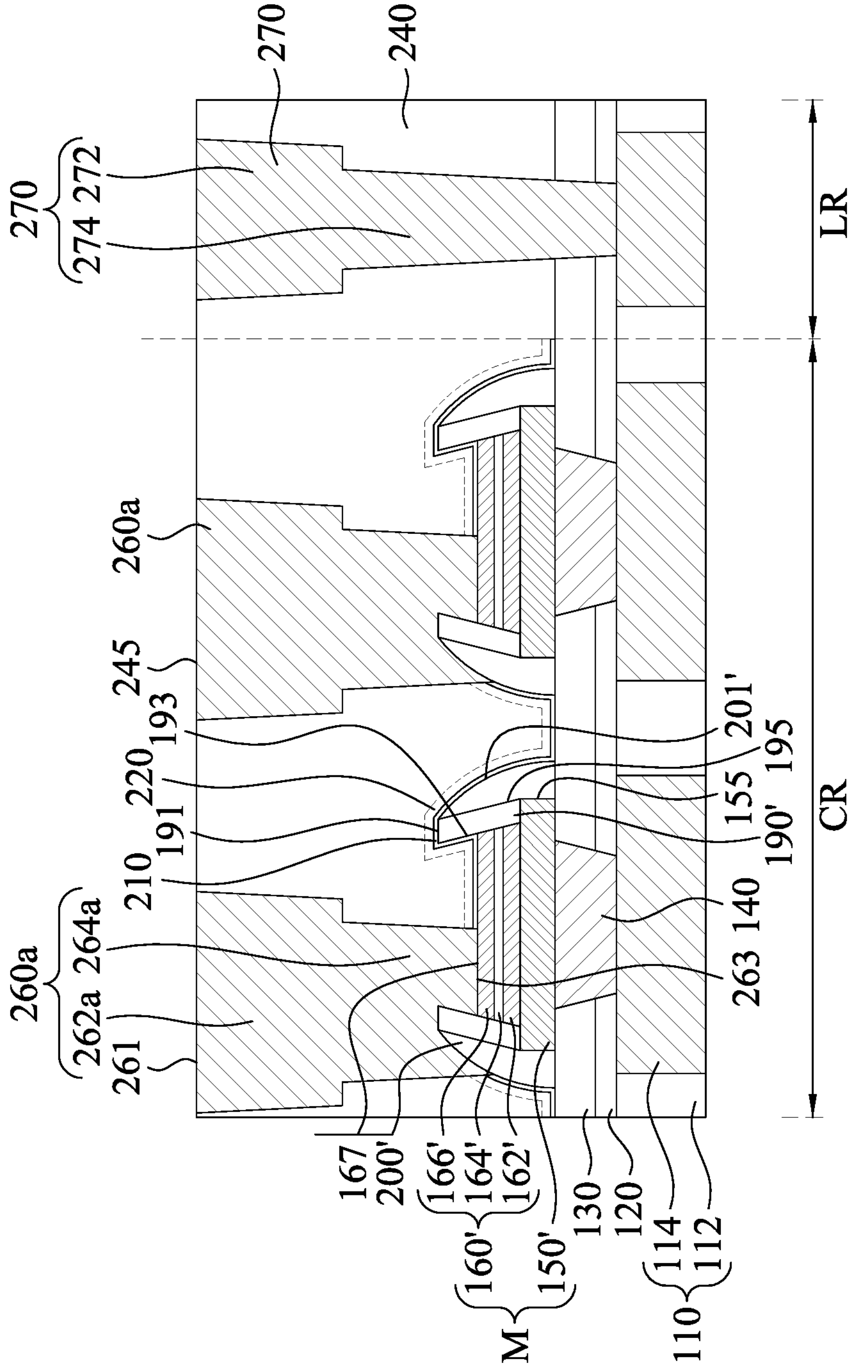
FIG. 20 is a cross-sectional views of a memory device in accordance with some embodiments of the present disclosure.

Reference is made to FIG. 20. In FIG. 20, the memory device includes the substrate 110, the bottom electrode vias 140, the bottom electrodes 150', the memory layers 160', and the conductive feature **260*a* and 270. The difference between the memory device in FIG. 20 and the memory device in FIG. 19 pertains to positions of the conductive feature 260*a*. In FIG. 20, the conductive features 260*a* each including a top conductive line 262*a* and a top electrode via 264*a* are shifted from the memory cells M, such that the top electrode vias 264*a* of the conductive features 260*a* are landed on the second spacers 200' and the first spacers 190'. Since the bottom electrodes 150' are covered by the second spacers 200', the top electrode via 264*a* of the conductive features 260*a* may not be electrically connected to the bottom electrodes 150'. As such, the short problem can be avoided or prevented. Materials, configurations, dimensions, processes and/or operations regarding the substrate 110, the bottom electrode vias 140, the bottom electrodes 150', the memory layers 160', and the conductive feature 270 of FIG. 20 are similar to or the same as those of FIG. 19**, and, therefore, a description in this regard will not be repeated hereinafter.

In some embodiments, each of the conductive features **260*a* is in contact with the first spacers 190' and the second spacers 200'. In some embodiments, each of the second spacers 200' is in contact with the top electrode via 264*a* of the conductive feature 260*a* and the bottom electrodes 150'. In some embodiments, since the first spacers 190' has the depth in a range of about 250 angstroms to about 300 angstroms, an accommodate space for forming the conductive features 260*a* is still enough over the memory layers 160'**.

Figure 21:
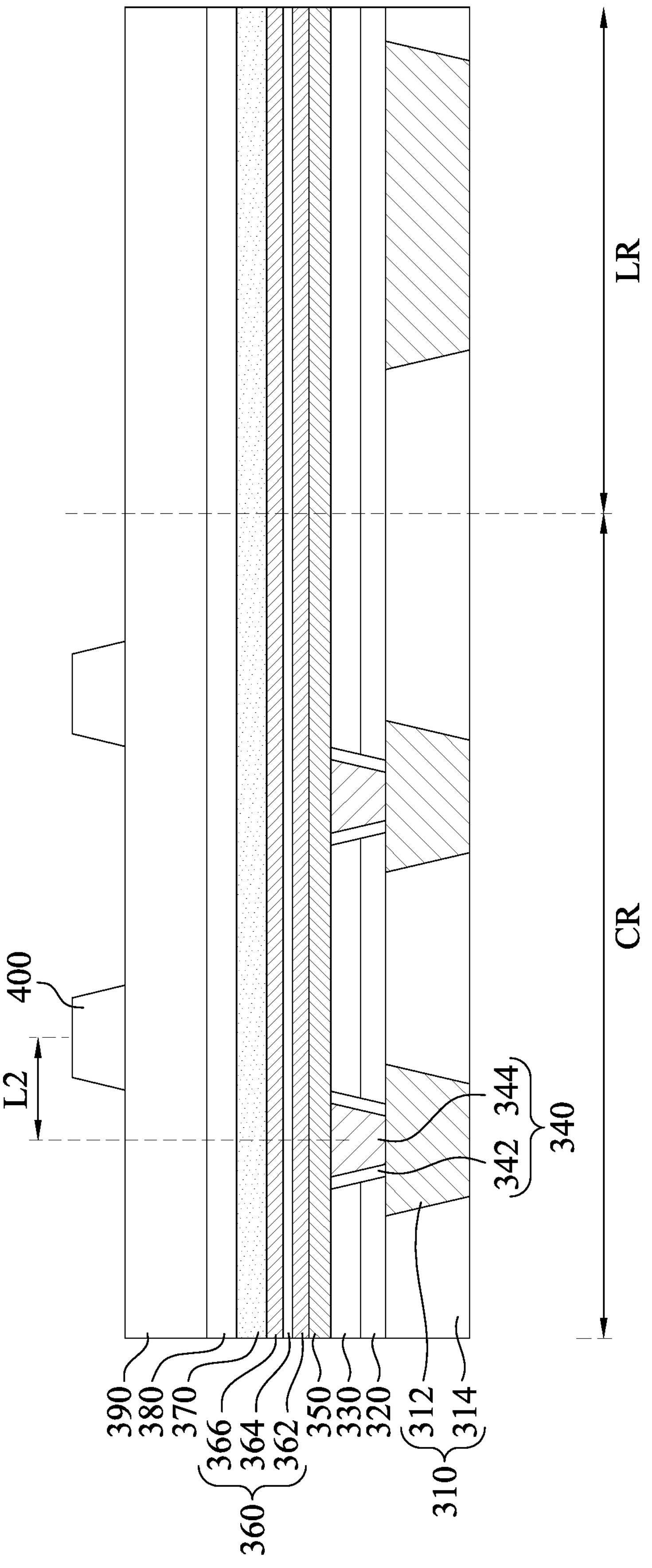
FIG. 21 to FIG. 29 are cross-sectional views of a memory device at various stages of manufacture in accordance with some embodiments of the present disclosure.

FIG. 21 to FIG. 29 are cross-sectional views of a memory device at various stages of manufacture in accordance with some embodiments of the present disclosure. Reference is made to FIG. 21. A wafer has a substrate 310 thereon. The substrate 310 has a logic region LR where logic circuits are to be formed and a cell region CR where memory devices are to be formed. The substrate 310 includes an interlayer dielectric (ILD) layer 314 with conductive features 312 over the logic region LR and the memory region CR. A first dielectric layer 320 and a second dielectric layer 330 are formed over the logic region LR and the cell region CR of the substrate 310 in a sequence. Bottom electrode vias (BEVA) 340 are formed within the first dielectric layer 320 and the second dielectric layer 330. In some embodiments, each of the bottom electrode vias 340 includes a diffusion barrier layer 342 and a filling metal structure 344 filling a recess in the diffusion barrier layer. The diffusion barrier layer 342 may be a titanium nitride (TiN) layer or a tantalum nitride (TaN) layer, which can act as a suitable barrier to prevent metal diffusion. The filling metal structure 344 may be titanium (Ti), tantalum (Ta), platinum (Pt), ruthenium (Ru), tungsten (W), aluminum (Al), copper (Cu), the like, and/or combinations thereof.

A bottom electrode layer 350 is conformally formed over the bottom electrode vias 340 and the second dielectric layer 330. A memory material layer 360 is formed over the bottom electrode layer 350. In some embodiments, the memory material layer 360 includes a first magnetic layer 362, a tunnel barrier layer 364 and a second magnetic layer 366 are formed in sequence over the bottom electrode layer 350. A top electrode layer 370 is conformally formed over the memory material layer 360.

In some embodiments, the substrate 310, the first dielectric layer 320, the second dielectric layer 330, the bottom electrode vias 340, the bottom electrode layer 350, the memory material layer 360, and the top electrode layer 370 respectively correspond to the substrate 110, the first dielectric layer 120, the second dielectric layer 130, the bottom electrode vias 140, the bottom electrode layer 150, the memory material layer 160, and the top electrode layer 170 in FIG. 4, and materials, configurations, dimensions, processes and/or operations regarding the substrate 310, the first dielectric layer 320, the second dielectric layer 330, the bottom electrode vias 340, the bottom electrode layer 350, the memory material layer 360, and the top electrode layer 370 are similar to or the same as those in FIG. 4, and, therefore, a description in this regard will not be repeated hereinafter.

A first hard mask layer 380 and a second hard mask layer 390 are formed over the top electrode layer 370 in sequence. In some embodiments, at least one of the first hard mask layer 380 and the second hard mask layer 390 is formed from a dielectric material. The first hard mask layer 380 and/or the second hard mask layer 390 may include silicon carbide (SiC), silicon oxynitride (SiON), silicon nitride (SiN), silicon dioxide ($SiO_2$), amorphous carbon, the like, and/or combinations thereof. In some embodiments, at least one of the first hard mask layer 380 and the second hard mask layer 390 is formed from a conductive material. In some embodiments, the first hard mask layer 380 and the second hard mask layer 390 include different materials. In some other embodiments, the first hard mask layer 380 and the second hard mask layer 390 includes the same material. The first hard mask layer 380 and the second hard mask layer 390 may be formed by acceptable deposition techniques, such as CVD, ALD, PVD, the like, and/or combinations thereof.

A patterned mask 400 is formed over the second hard mask layer 390. In some embodiments, the patterned mask 400 is a photoresist. In some embodiments, the patterned mask 400 is not aligned to each of the bottom electrode vias 340. For example, a center region of the patterned mask 400 is separated from a center region of the bottom electrode vias 340 by a distance L2. The distance L2 may be referred as an overlay shift due to process variation.

Figure 22:
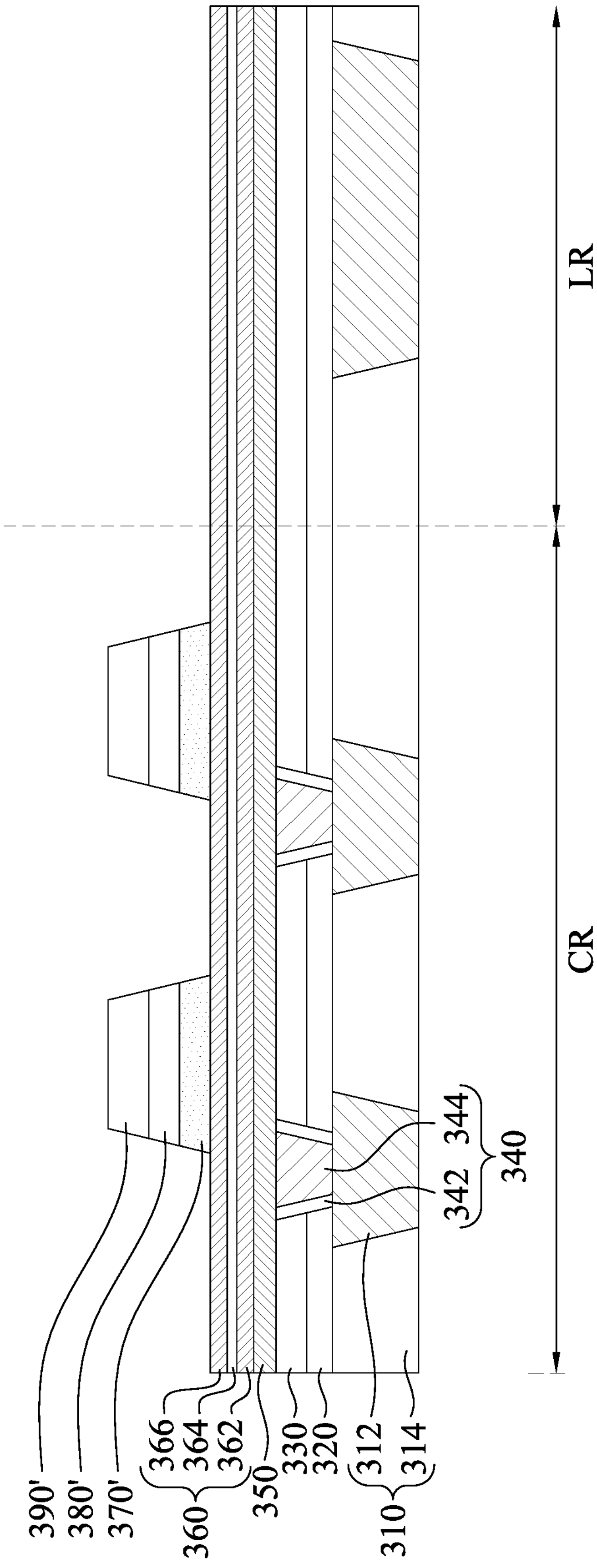

Reference is made then made to FIG. 21 and FIG. 22. An etching process is performed to remove portions of the second hard mask layer 390, the underlying first hard mask layer 380, and the underlying top electrode layer 370 not protected by the patterned mask 400. The etching process stops when the second magnetic layer 366 of the memory material layer 360 is reached. The second hard mask layer 390, the underlying first hard mask layer 380, and the underlying top electrode layer 370 may be etched using acceptable etching techniques, such as by using an anisotropic etching process. In some embodiments, the memory material layer 360 may has a higher etch resistance to the etching process than that of the top electrode layer 370. After the removal, top electrodes 370', first hard mask covers 380' and second hard mask covers 390' are remained, and the second magnetic layer 366 of the memory material layer 360 is exposed, as shown in FIG. 22. The patterned mask 400 is removed using, for example, an ashing process, after the etching process.

Figure 23:
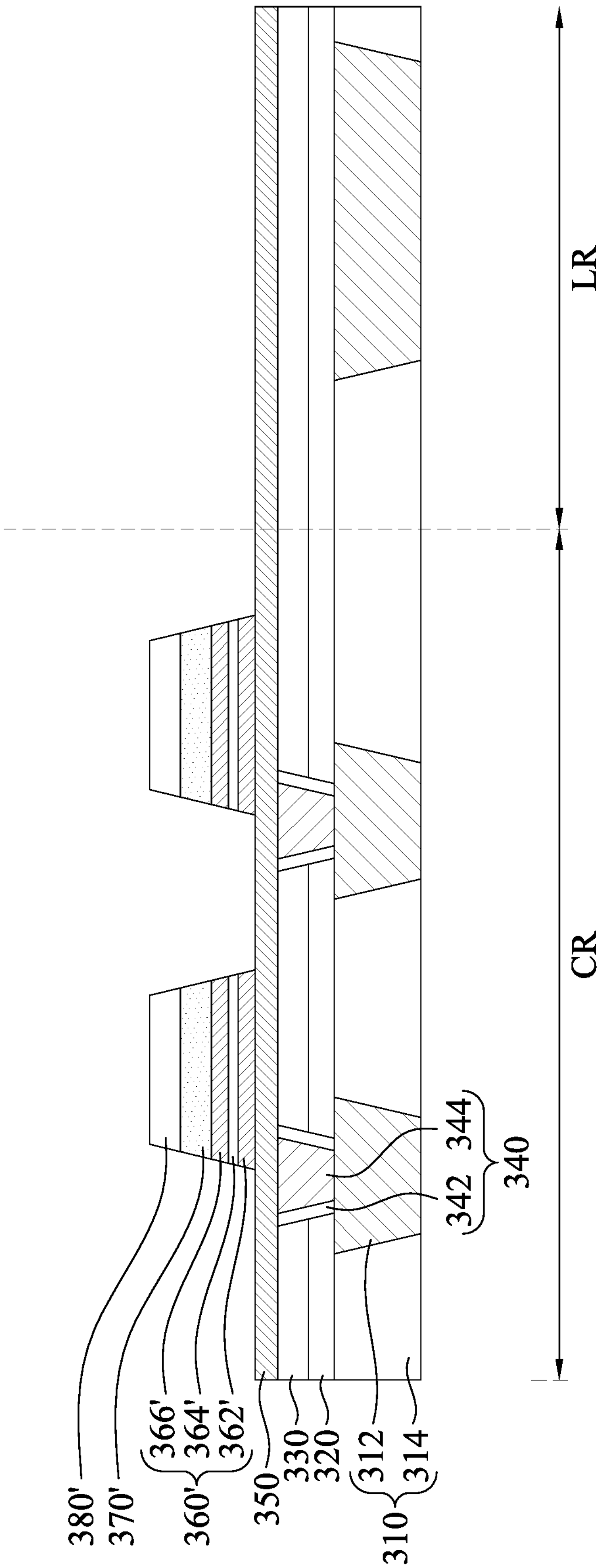

Reference is made then made to FIG. 22 and FIG. 23. An etching process is performed to remove exposed portions of the memory material layer 360 (i.e., the second magnetic layer 366, the underlying tunnel barrier layer 364, and the underlying first magnetic layer 362) not protected by the top electrodes 370', the first hard mask covers 380', and the second hard mask covers 390'. The etching process stops when the bottom electrode layer 350 is reached. The memory material layer 360 may be etched using acceptable etching techniques, such as by using an anisotropic etching process. After the etching process, memory layers 360' (including second magnetic structures 366', underlying tunnel barrier structures 364', and underlying first magnetic structures 362') are remained, and the bottom electrode layer 350 is exposed, as shown in FIG. 23. In some embodiments, the second hard mask covers 390' are removed during the etching process in FIG. 23. In some other embodiments, after the etching process, the second hard mask covers 390' are removed by using an etching process or other suitable processes.

Figure 24:
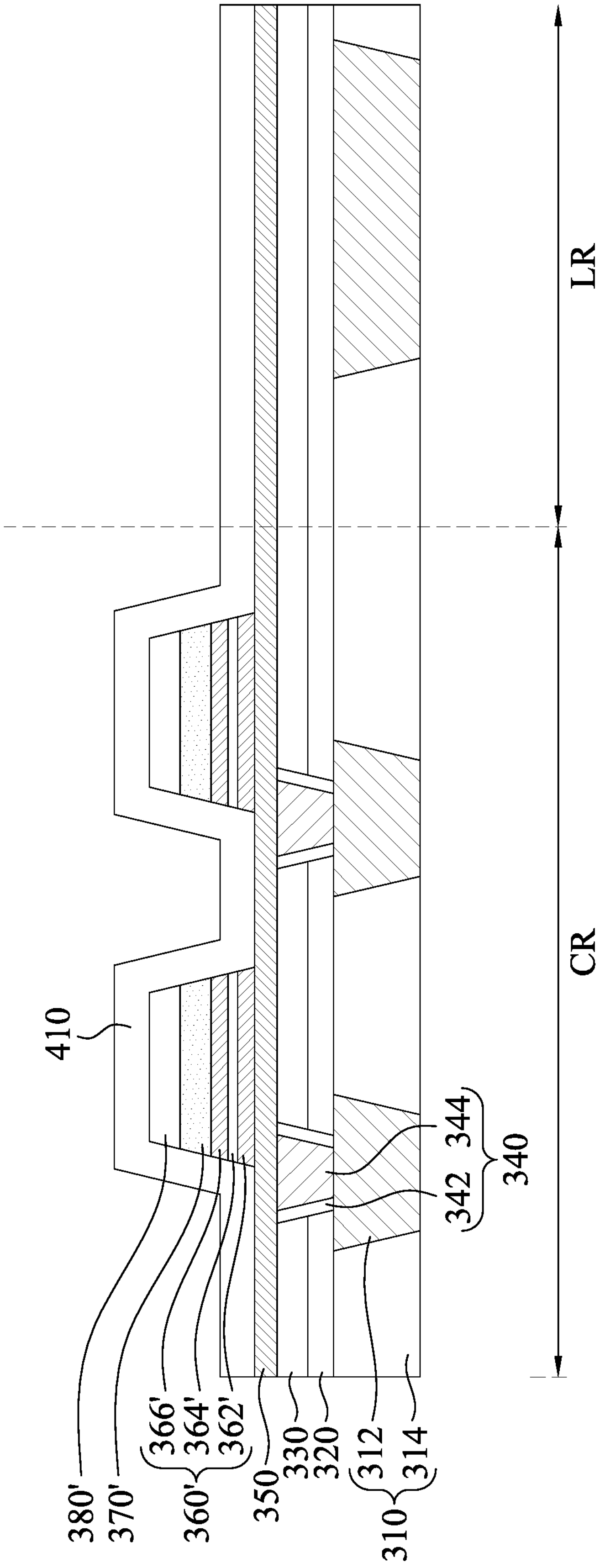

Reference is then made to FIG. 23 and FIG. 24. A first spacer layer 410 is conformally formed over the structure of FIG. 23. In greater details, the first spacer layer 410 is conformally formed over the bottom electrode layer 350, along sidewalls of the memory layer 360', and over the top electrodes 370'. In other words, the first spacer layer 410 covers the sidewalls and top surfaces of the top electrodes 370'. In some embodiments, the first spacer layer 410 includes dielectric materials, such as nitride (e.g., silicon nitride). In some embodiments, the first spacer layer 410 corresponds to the first spacer layer 190 in FIG. 7, and materials, configurations, dimensions, processes and/or operations regarding the first spacer layer 410 is similar to or the same as the first spacer layer 190 in FIG. 7, and, therefore, a description in this regard will not be repeated hereinafter.

Figure 25:
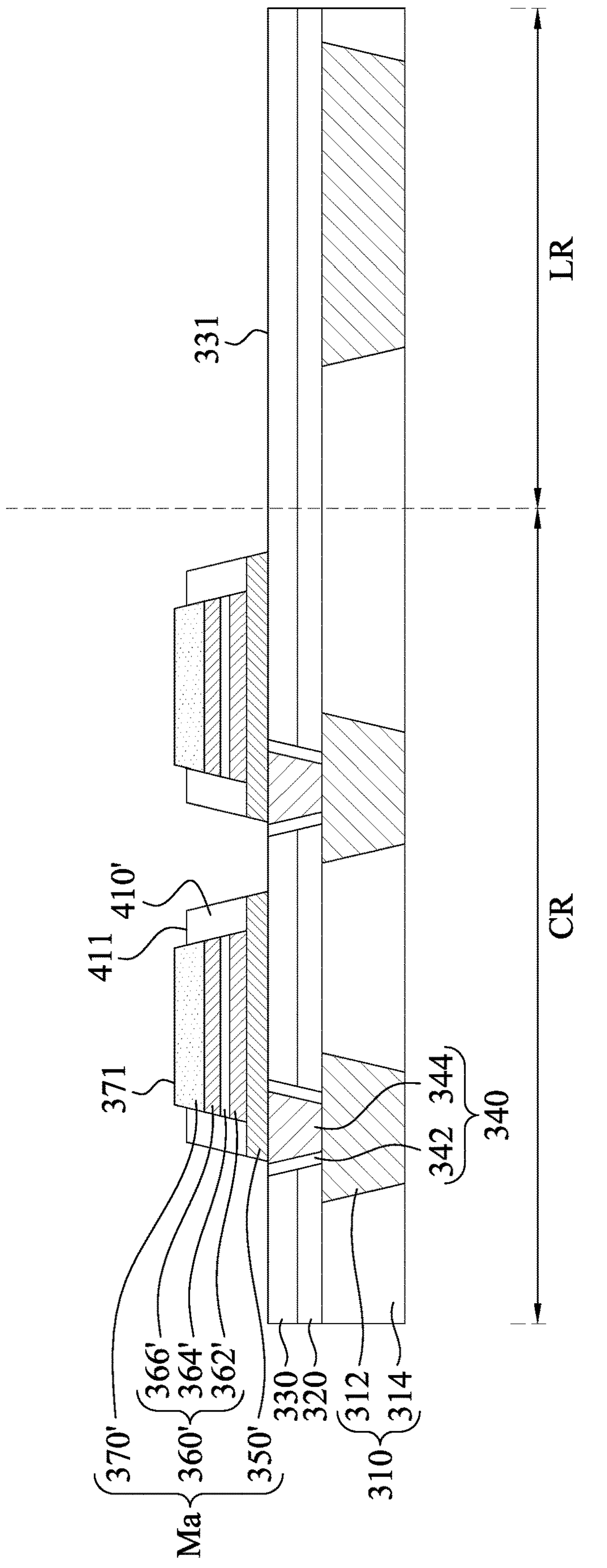

Reference is then made to FIG. 24 and FIG. 25. An etching process is performed to remove horizontal portions of the first spacer layer 410. After the removal, first spacers 410' (i.e., vertical portions of the first spacer layer 410) are remained, and top surfaces 371 of the top electrodes 370' are exposed, as shown in FIG. 25. In some embodiments, the etching process is performed to further remove the first hard mask covers 380' over the top electrodes 370'. In some embodiments, after the etching process, a top surface 411 of each of the first spacers 410' is lower than a top surface 371 of each of the top electrodes 370'.

In some embodiments, an etching process is performed to remove exposed portions of the bottom electrode layer 350 not protected by the memory layer 360', the top electrodes 370', and the first spacers 410'. The etching process stops when the second dielectric layer 330 is reached since the second dielectric layer 330 may have a higher etch resistance to the etching process than that of the bottom electrode layer 350. The bottom electrode layer 350 may be etched using acceptable etching techniques, such as by using an anisotropic etching process. After the etching process, bottom electrodes 350' are remained, and a top surface 331 of the second dielectric layer 330 is exposed, as shown in FIG. 25. As such, memory cells Ma are formed. Each of the memory cells Ma includes the bottom electrode 350', the memory layer 360', and the top electrode 370'. In some embodiments, each of the memory cells Ma includes the bottom electrode 350', the memory layer 360', the top electrode 370', and the first spacer 410'. In some embodiments, each of the memory cells Ma is not aligned to each of the bottom electrode vias 340. To be specific, a center region of each of the memory cells Ma is separated from a center region of each of the bottom electrode vias 340 by a distance (e.g., the distance L2 in FIG. 21). In some embodiments, each of the memory cells Ma is not aligned to each of the conductive features 312. To be specific, a center region of each of the memory cells Ma is separated from a center region of each of the conductive features 312 by a distance (e.g., the distance L2 in FIG. 21).

Figure 26:
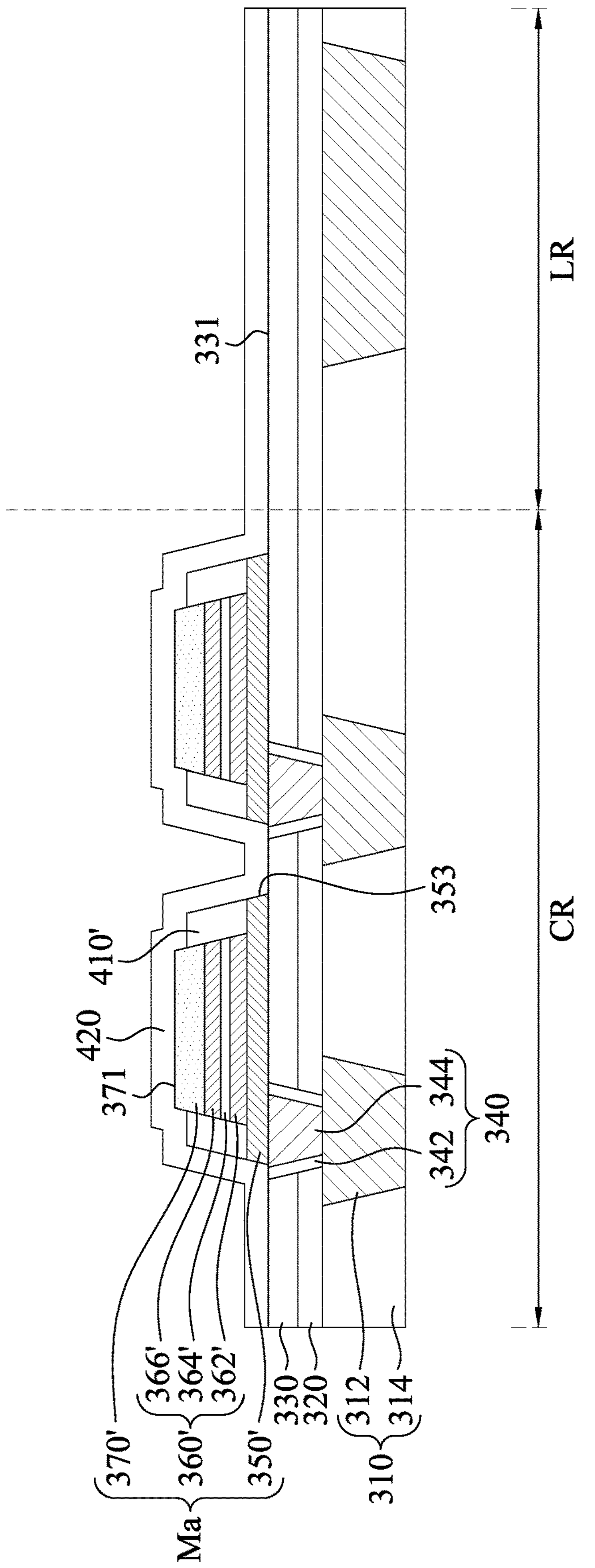

Reference is then made to FIG. 25 and FIG. 26. A second spacer layer 420 is conformally formed over the structure of FIG. 25. In greater details, the second spacer layer 420 is formed over the second dielectric layer 330, over the top electrodes 370', along sidewalls of the bottom electrodes 350', and along sidewalls of the first spacers 410'. In other words, the second spacer layer 420 covers top surfaces 371 of the top electrodes 370' and the top surface 331 of the second dielectric layer 330. In some embodiments, the second spacer layer 420 includes dielectric materials, such as oxide (e.g., silicon oxide). In some embodiments, the second spacer layer 420 corresponds to the second spacer layer 200 in FIG. 10, and materials, configurations, dimensions, processes and/or operations regarding the second spacer layer 420 is similar to or the same as the second spacer layer 200 in FIG. 10, and, therefore, a description in this regard will not be repeated hereinafter.

Figure 27:
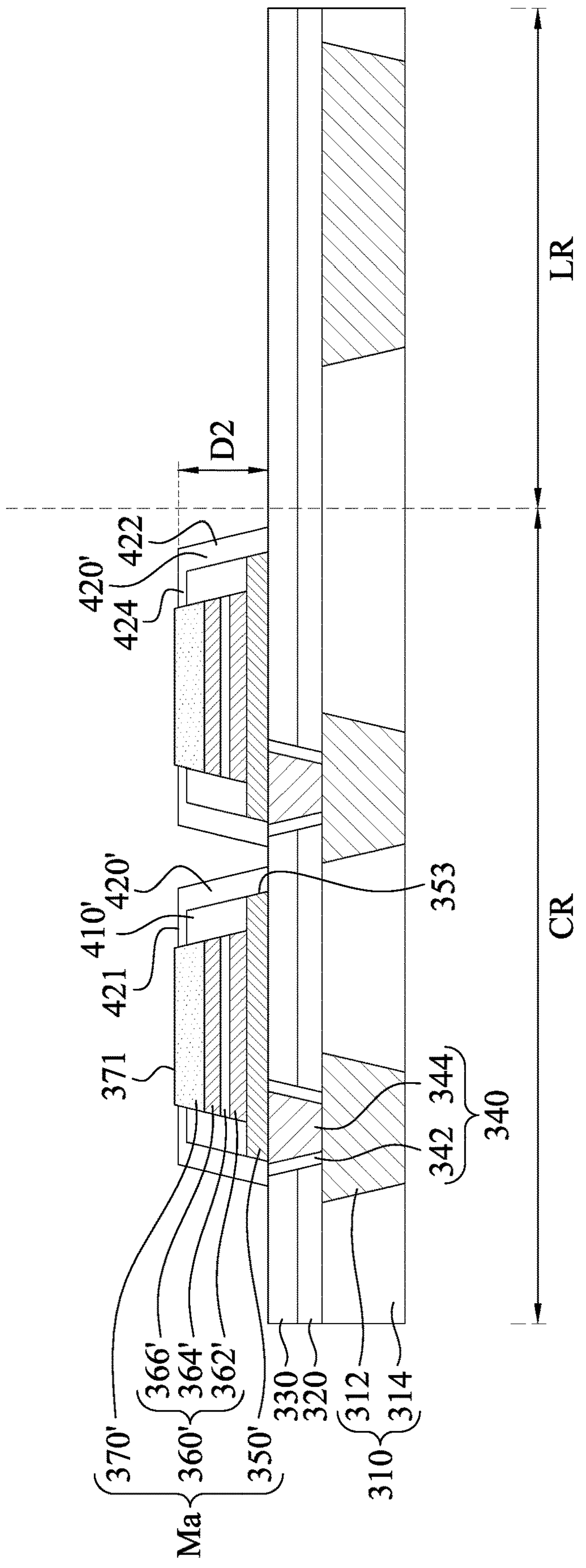

Reference is then made to FIG. 26 and FIG. 27. An etching process is performed to remove a portion of the second spacer layer 420. After the removal, second spacers 420' are remained. Further, the etching process exposes the top surfaces 371 of the top electrodes 370' and the top surface 331 of the second dielectric layer 330. In some embodiments, the first spacers 410' and the second spacers 420' have different profiles. Each of the second spacers 420' has a vertical portion 422 and a horizontal portion 424 over the vertical portion 422. The vertical portion 422 of the second spacers 420' is substantially parallel to the first spacer 410'. The horizontal portion 424 of the second spacer 420' overlaps with the first spacer 410'. In some embodiments, top surfaces 421 of the second spacers 420' are lower than the top surface 371 of the top electrodes 370', such that a portion of sidewalls of the top electrodes 370' is exposed. In some other embodiments, the top surfaces 421 of the second spacers 420' are substantially coplanar with the top surfaces 371 of the top electrodes 370', such that the entirely sidewalls of the top electrodes 370' are covered by the first spacers 410' and the second spacers 420'.

In some embodiments, the second spacers 420' covers a sidewall 353 of each of the bottom electrodes 350'. The second spacers 420' can protect the bottom electrodes 350' and prevent the conductive materials (e.g., top electrode vias 444 in FIG. 29) from being electrically connected to the bottom electrodes 350'. If the second spacers 420' does not cover the sidewall 353 of each of the bottom electrodes 350', the bottom electrodes 350' may be electrically connected or in contact with the top electrode vias (e.g., top electrode vias 444 in FIG. 29), and thus the short problem may occur. In some embodiments, a depth D2 of each of the first spacers 410' is greater than a thickness of the memory layer 360'.

In some embodiments, the etching process is a selectively etching process which etches dielectric material (e.g., the second spacers 420') at a higher etching rate than etches metal materials (e.g., the top electrodes 370'). As such, the top electrodes 370' protrude from the second spacers 420'.

Figure 28:
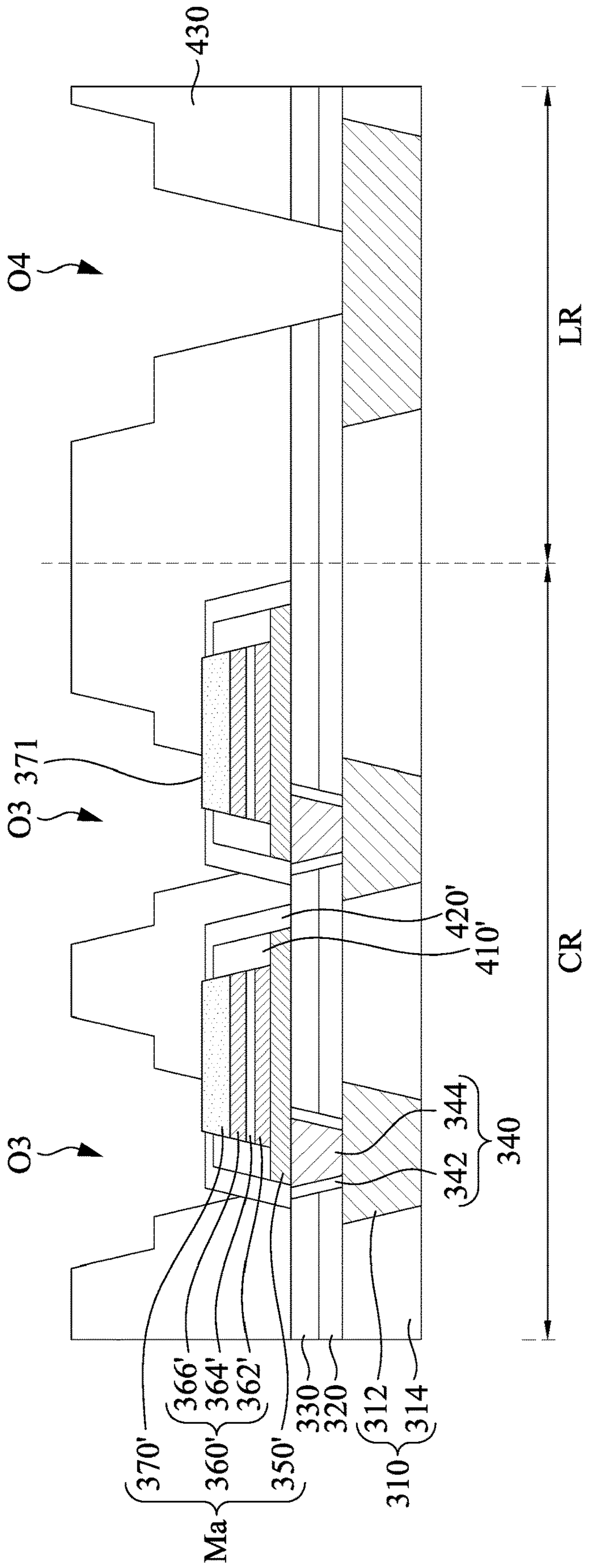

Reference is then made to FIG. 28. A third dielectric layer 430 is deposited over the structure of FIG. 27. In other words, the third dielectric layer 430 covers the memory cell Ma over the cell region CR and the second spacers 420' of the substrate 310, and covers the second dielectric layer 330 over the cell region CR and the logic region LR of the substrate 310. In some embodiments, the third dielectric layer 430 corresponds to the third dielectric layer 240 in FIG. 16, and materials, configurations, dimensions, processes and/or operations regarding the third dielectric layer 430 is similar to or the same as the third dielectric layer 240 in FIG. 16, and, therefore, a description in this regard will not be repeated hereinafter.

Thereafter, an etching process is performed to form openings O3 and O4. The openings O3 are formed in the third dielectric layer 430 and expose the second spacers 420', and a portion of the top surfaces 371 of the top electrodes 370'. The opening O4 is formed in the first dielectric layer 320, the second dielectric layer 330, and third dielectric layer 430, and exposes the conductive feature 312 of the substrate 310.

In some embodiments, the etching process is a dual damascene process, which creates both trenches and via holes at once. For example, in FIG. 28, each of the openings O3 and O4 has a trench and a via hole under the trench. The via holes of the openings O3 expose the top surfaces 371 of the top electrodes 370', and the via hole of the openings O4 exposes the conductive feature 312 over the logic region LR of the substrate 310.

Figure 29:
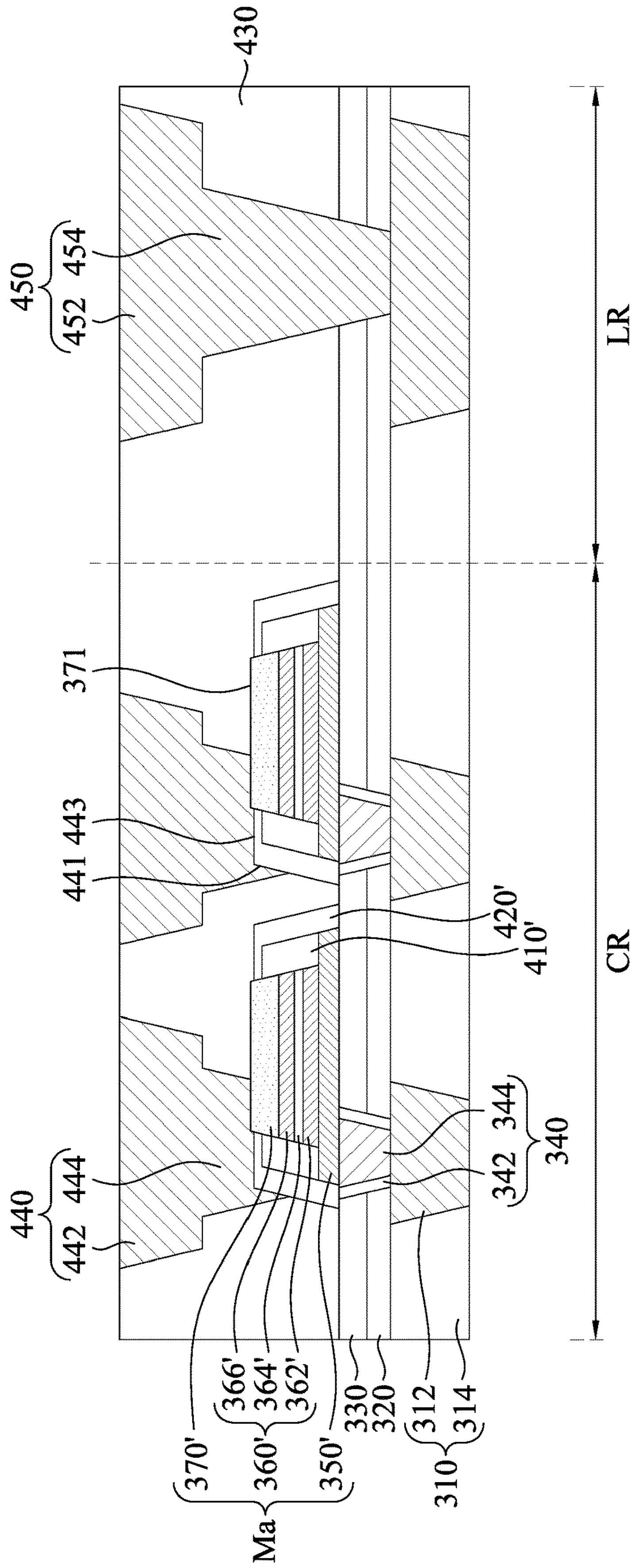

Reference is made to FIG. 28 and FIG. 29. A conductive material is filled in the openings O3 and O4 to form conductive features 440 and 450. Each of the conductive features 440 includes a top conductive line 442 and a top electrode via 444 between the top conductive line 442 and the memory layers 360'. The conductive feature 450 includes a conductive line 452 and a via 454 between the conductive line 452 and one of the conductive features 312. The conductive features 440 are electrically connected to the top electrodes 370' over the cell region CR, and the conductive feature 450 is electrically connected to the conductive feature 312 over the logic region LR. In FIG. 29, the conductive features 440 are shifted from the memory cells Ma, such that the top electrode vias 444 of the conductive features 440 are partially landed on the second spacers 420'. Since the bottom electrodes 350' are covered by the second spacers 420', the conductive features 440 may not be electrically connected to the bottom electrodes 350'. As such, the short problem can be avoided or prevented.

In some embodiments, each of the top conductive lines 442 is wider than each of the top electrode vias 444. Each of the top electrode vias 444 is in contact with the second spacers 420' and the top electrodes 370'. Each of the top electrode vias 444 has an inclined sidewall 441 in contact with an outer sidewall of the second spacers 420', and a surface 443 connected to the inclined sidewall 441. The surface 443 of each of the conductive features 440 is lower than the top surface 371 of each of the top electrodes 370'. In some embodiments, the conductive features 440 and 450 respectively correspond to the conductive features 260*a* and 270 in FIG. 20, and materials, configurations, dimensions, processes and/or operations regarding the conductive features 440 and 450 of FIG. 29 are similar to or the same as those of FIG. 20, and, therefore, a description in this regard will not be repeated hereinafter.

Figure 30:
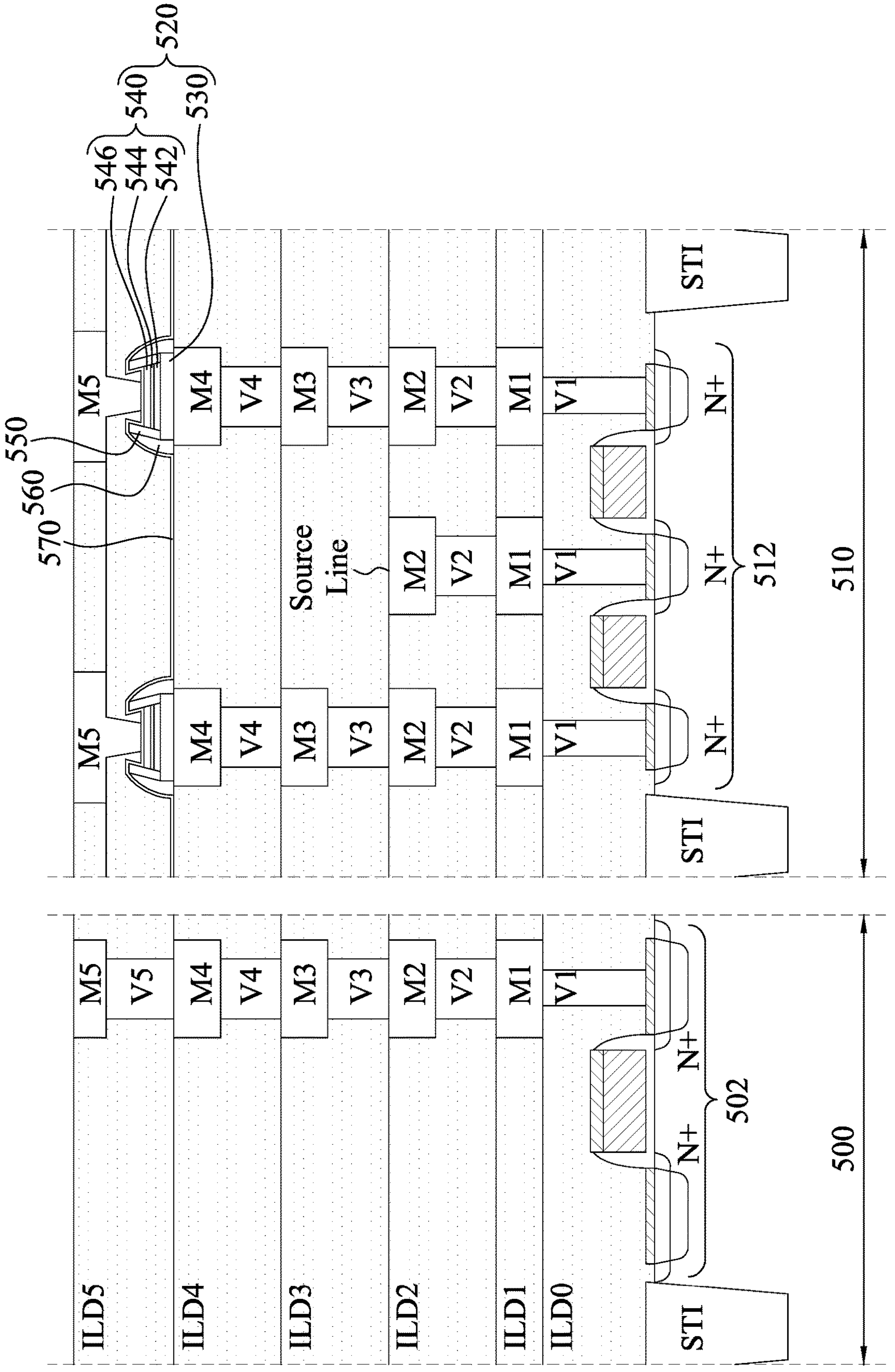
FIG. 30 illustrates an integrated circuit including memory devices and logic devices.

FIG. 30 illustrates an integrated circuit including MRAM devices and logic devices. The integrated circuit includes a logic region 500 and a MRAM region 510. In some embodiments, the logic region 500 corresponds to the logic region LR in FIGS. 1-29, and the MRAM region 510 corresponds to the cell region CR in FIGS. 1-29. Logic region 500 may include circuitry, such as the exemplary transistor 502, for processing information received from MRAM devices 520 in the MRAM region 510 and for controlling reading and writing functions of MRAM devices 520. In some embodiments, the MRAM device 520 (corresponding to the memory cell M in FIGS. 19 and 20 and/or the memory cell Ma in FIG. 29) includes a bottom electrode 530 and a memory layer 540. The memory layer 540 includes a first magnetic structure 542, a tunnel barrier structure 544, and a second magnetic structure 546. In some embodiments, the integrated circuit further includes conductive features (or metallization layers) M5 over the memory layer 540. In some embodiments, the MRAM device 520 further includes a first spacer 550 over the bottom electrodes 530 and lining with an outer sidewall of the memory layer 540. The first spacer 550 extends upwards from the bottom electrode 530 and a top surface of the first spacer 550 is higher than a top surface of the memory layer 540. In some embodiments, the MRAM device 520 further includes a second spacer 560 lining with outer sidewalls of the bottom electrode 530 and the first spacer 550. An etch stop layer 570 is disposed over the second spacer 560, and the etch stop layer 570 is in the MRAM region 510 while not over the logic region 500. In other words, the logic region 500 is free of the etch stop layer 570.

The integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 500 includes a full metallization stack, including a portion of each of metallization layers M1-M5 connected by interconnects V2-V5, with V1 connecting the stack to a source/drain contact of logic transistor 502. The MRAM region 510 includes a full metallization stack connecting MRAM devices 520 to transistors 512 in the MRAM region 510, and a partial metallization stack connecting a source line to transistors 512 in the MRAM region 510. MRAM devices 520 are depicted as being fabricated in between the top of the M4 layer and the bottom the M5 layer. In some embodiments, the interconnect V5 and the metallization layer M5 over the logic region 500 are referred as the conductive feature 270 in FIG. 19, and the metallization layer M5 in the MRAM region 510 is referred as the conductive feature 260 in FIG. 19. Also included in integrated circuit is a plurality of ILD layers. Six ILD layers, identified as ILD0 through ILD5 are depicted in FIG. 30 as spanning the logic region 500 and the MRAM region 510. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the dielectric layer over the memory cells can be formed without voids formed therein due to the removal of the top electrodes over the memory layers of the memory cells. Another advantage is that the top electrode via is electrically connected to the memory layer, such that the process window can be enlarged. Further, the spacer structure (e.g., the first spacer and the second spacer) can protect the bottom electrode from being electrically connected to the top electrode vias.

According to some embodiments, a method for manufacturing a memory device includes forming a dielectric layer over a substrate, in which the substrate has a cell region and a logic region adjacent to the cell region. A bottom electrode, a memory layer, and a top electrode are formed in sequence over the cell region of the substrate. A first spacer is formed extending upwards from the bottom electrode. A second spacer is formed extending upwards from the dielectric layer and lining with sidewalls of the bottom electrode and the first spacer.

According to some embodiments, a method for manufacturing a memory device includes forming a dielectric layer over a substrate, in which the substrate has a cell region and a logic region adjacent to the cell region. A bottom electrode is formed over the cell region of the substrate. A memory layer is formed over the bottom electrode. A top electrode is formed over the memory layer. The top electrode is etched to expose the memory layer. A top electrode via is formed over the memory layer such that the top electrode via is electrically connected to the memory layer.

According to some embodiments, a memory device includes a first dielectric layer, a conductive feature, a bottom electrode, a memory layer, a top electrode via, a first spacer, and an etch stop layer. The conductive feature is embedded in the first dielectric layer. The bottom electrode is electrically connected to the conductive feature. The memory layer is disposed over the bottom electrode. The top electrode via is disposed over and in contact with the memory layer. The first spacer is disposed over the bottom electrode and lining with a sidewall of the memory layer. The etch stop layer lining a top surface and an inner sidewall of the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a dielectric layer over a substrate, wherein the substrate has a cell region and a logic region adjacent to the cell region;

forming a bottom electrode, a memory layer, and a top electrode in sequence over the cell region of the substrate;

forming a first spacer extending upwards from the bottom electrode;

depositing a dielectric material over the dielectric layer on the cell region and the logic region;

etching the dielectric material to form a second spacer extending upwards from the dielectric layer and lining with sidewalls of the bottom electrode and the first spacer and to remove the dielectric material entirely from the logic region, wherein the second spacer is made of the dielectric material and has a bottom surface lower than a top surface of the bottom electrode;

etching the top electrode to expose a top surface of the memory layer and an inner sidewall of the first spacer, wherein after etching the top electrode, the exposed top surface of the memory layer is lower than the exposed inner sidewall of the first spacer; and after etching the top electrode, forming a top electrode via on the memory layer.

2. The method of claim 1, wherein forming the first spacer comprises:

forming a first spacer layer over the top electrode; and etching the first spacer layer over the top electrode to form the first spacer.

3. The method of claim 1, wherein forming the first spacer comprises:

pattering a portion of the first spacer such that a top surface of the first spacer is lower than a top surface of the top electrode.

4. The method of claim 1, further comprising:

forming an etch stop layer over the first spacer and the second spacer.

5. The method of claim 4, further comprising:

etching the etch stop layer such that the logic region is free of the etch stop layer.

6. The method of claim 1, wherein a bottom surface of the top electrode via is lower than a top surface of the first spacer.

7. The method of claim 6, wherein the top electrode via is contact with the second spacer.

8. The method of claim 1, wherein the bottom surface of the second spacer is level with a bottom surface of the bottom electrode.

9. A method, comprising:

forming a conductive feature embedded in a first dielectric layer;

forming a bottom electrode on the conductive feature, wherein the bottom electrode is electrically connected to the conductive feature;

forming a magnetic tunnel junction (MTJ) layer over the bottom electrode;

forming a top electrode over the MTJ layer;

forming a first spacer over the bottom electrode, wherein the first spacer lines with a sidewall of the MTJ layer;

forming a top electrode via over the MTJ layer, wherein the top electrode via is in direct contact with the MTJ layer, wherein forming the top electrode via over the MTJ layer comprises:

etching the top electrode such that a recess is formed on the MTJ layer; and after etching the top electrode, depositing a second dielectric layer covering the MTJ layer and the first spacer, wherein the second dielectric layer is disposed in the recess; and forming an etch stop layer overlapping a top surface of the first spacer and in direct contact with an inner sidewall of the first spacer.

10. The method of claim 9, wherein the top surface of the first spacer is upper than a bottom surface of the top electrode via.

11. The method of claim 9, further comprising:

after forming the first spacer, forming a second spacer covering a sidewall of the bottom electrode and an outer sidewall of the first spacer.

12. The method of claim 11, wherein the second spacer is in contact with the top electrode via and the bottom electrode.

13. The method of claim 11, wherein the etch stop layer has a portion in contact with the MTJ layer.

14. The method of claim 11, wherein forming the top electrode via over the MTJ layer comprises:

depositing a second dielectric layer covering the MTJ layer and the first spacer;

etching the second dielectric layer to form an opening in the second dielectric layer; and filling the opening with a conductive material, wherein a top surface of the second dielectric layer is substantially level with a top surface of the top electrode via.

15. The method of claim 9, further comprising:

after forming the first spacer, forming a second spacer covering a sidewall of the bottom electrode and an outer sidewall of the first spacer.

16. The method of claim 15, wherein the second spacer is laterally between the first spacer and the top electrode via.

* * * * *